(12) United States Patent
Fukui et al.

(10) Patent No.: US 12,173,411 B2
(45) Date of Patent: Dec. 24, 2024

(54) CUTTING TOOL

(71) Applicant: Sumitomo Electric Industries, Ltd., Osaka (JP)

(72) Inventors: Haruyo Fukui, Osaka (JP); Nozomi Tsukihara, Osaka (JP); Anongsack Paseuth, Osaka (JP); Toshihiro Tabata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/033,361

(22) PCT Filed: Sep. 22, 2022

(86) PCT No.: PCT/JP2022/035450
§ 371 (c)(1),
(2) Date: Apr. 24, 2023

(87) PCT Pub. No.: WO2024/062611
PCT Pub. Date: Mar. 28, 2024

(65) Prior Publication Data
US 2024/0102173 A1  Mar. 28, 2024

(51) Int. Cl.
*B23B 27/14* (2006.01)
*C23C 28/04* (2006.01)

(52) U.S. Cl.
CPC .......... *C23C 28/044* (2013.01); *B23B 27/146* (2013.01); *B23B 27/148* (2013.01);
(Continued)

(58) Field of Classification Search
CPC . B32B 27/146; B32B 27/148; B32B 2224/24; B32B 2224/36; C23C 26/042;
(Continued)

(56) References Cited

U.S. PATENT DOCUMENTS

| | | | |
|---|---|---|---|
| 2015/0361269 A1* | 12/2015 | Abe | C09D 1/00 204/192.12 |
| 2018/0099335 A1* | 4/2018 | Takeshita | C23C 14/0641 |

FOREIGN PATENT DOCUMENTS

| | | | |
|---|---|---|---|
| CN | 113981398 A | * | 1/2022 |
| JP | 09300105 A | * | 11/1997 |

(Continued)

OTHER PUBLICATIONS

Written Opinion mailed on Nov. 22, 2022, received for PCT Application PCT/JP2022/035450, filed on Sep. 22, 2022, 6 pages including English Translation.

*Primary Examiner* — Humera N. Sheikh
*Assistant Examiner* — Kevin Ct Li
(74) *Attorney, Agent, or Firm* — XSENSUS LLP

(57) ABSTRACT

A cutting tool is a cutting tool comprising a substrate and a coating film disposed on the substrate, in which the coating film includes a first layer, the first layer is composed of an alternate layer where a first unit layer and a second unit layer are alternately stacked, the first unit layer is composed of $Ti_{1-a-b}Al_aCe_bN$, a is 0.350 or more and 0.650 or less, b is 0.001 or more and 0.100 or less, the second unit layer is composed of $Al_cCr_{1-c}N$, c is 0.40 or more and 0.75 or less, and a and c satisfy a relationship of c>a.

8 Claims, 4 Drawing Sheets

(52) U.S. Cl.
CPC ........ *C23C 28/042* (2013.01); *B23B 2224/24* (2013.01); *B23B 2224/36* (2013.01)

(58) Field of Classification Search
CPC ... C23C 26/044; C23C 28/044; B23B 27/146; B23B 27/148
See application file for complete search history.

(56) References Cited

FOREIGN PATENT DOCUMENTS

| | | | |
|---|---|---|---|
| JP | H09-300105 | A | 11/1997 |
| JP | H09-323205 | A | 12/1997 |
| JP | 2005022023 | A * | 1/2005 |
| JP | 2014-162977 | A | 9/2014 |
| JP | 2017-064845 | A | 4/2017 |
| JP | 2021126738 | A * | 9/2021 |

* cited by examiner

CUTTING TOOL

CROSS-REFERENCE TO RELATED APPLICATION

The present application is based on PCT filing PCT/JP2022/035450, filed Sep. 22, 2022, the entire contents of which are incorporated herein by reference.

TECHNICAL FIELD

The present disclosure relates to a cutting tool.

BACKGROUND ART

A cutting tool comprising a substrate and a coating film disposed on the substrate has been conventionally used for cutting machining (PTL 1 and PTL 2).

CITATION LIST

Patent Literature

PTL 1: Japanese Patent Laying-Open No. 2017-64845
PTL 2: Japanese Patent Laying-Open No. H9-300105

SUMMARY OF INVENTION

A cutting tool according to one aspect of the present disclosure is a cutting tool comprising a substrate and a coating film disposed on the substrate, wherein
the coating film includes a first layer,
the first layer is composed of an alternate layer where a first unit layer and a second unit layer are alternately stacked,
the first unit layer is composed of $Ti_{1-a-b}Al_aCe_bN$,
a is 0.350 or more and 0.650 or less,
b is 0.001 or more and 0.100 or less,
the second unit layer is composed of $Al_cCr_{1-c}N$,
c is 0.40 or more and 0.75 or less, and
a and c satisfy a relationship of c>a.

A cutting tool according to another aspect of the present disclosure is a cutting tool comprising a substrate and a coating film disposed on the substrate, wherein
the coating film includes a first A layer,
the first A layer is composed of an alternate layer where a first unit layer and a third unit layer are alternately stacked,
the first unit layer is composed of $Ti_{1-a-b}Al_aCe_bN$,
a is 0.350 or more and 0.650 or less,
b is 0.001 or more and 0.100 or less,
the third unit layer is composed of $Al_dCr_{1-d-e}M_eN$,
M is silicon or boron,
d is 0.40 or more and 0.75 or less,
e is more than 0 and 0.05 or less, and
a and d satisfy a relationship of d>a.

DETAILED DESCRIPTION

Figure 1:
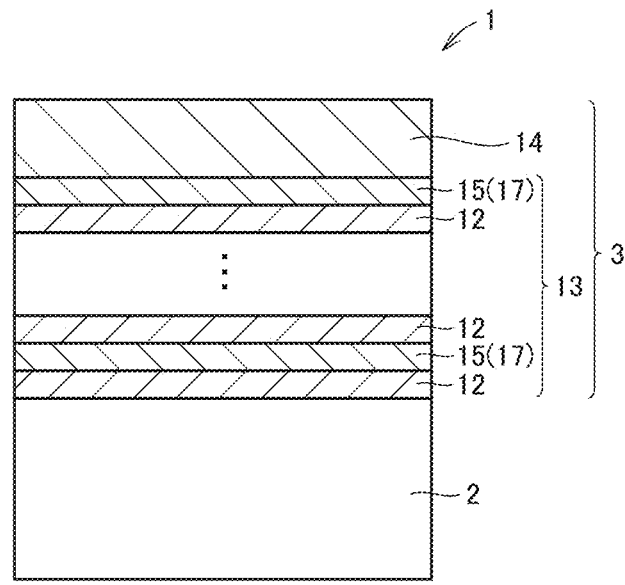
FIG. 1 is a schematic enlarged cross-sectional view of a cutting tool according to one embodiment of the present disclosure.
Figure 2:
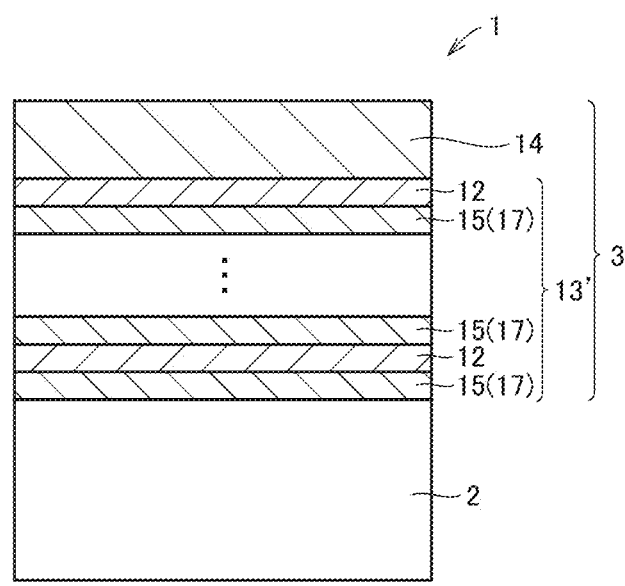
FIG. 2 is a schematic enlarged cross-sectional view of a cutting tool according to another embodiment of the present disclosure.

Problem to be Solved by the Present Disclosure

Cutting machining plays a key role among manufacturing techniques, and always continues to be demanded to be technically advanced and highly developed. While cutting machining techniques have been basically demanded to be increased in speed and efficiency and increased in accuracy, cutting of workpieces has been made difficult as recent trends, and responses thereto have also been demanded. Additionally, SDGs (Sustainable Development Goals) have recently attracted increasing attention in a cutting machining setting in order to realize a sustainable and better world by 2030. The sustainable development here means the construction of social infrastructure that not only causes no loss of resources required by future generations, but also can withstand natural threats. Therefore, high development of cutting machining techniques is expected to lead to environmental load reductions, for example, power saving in product manufacturing due to a reduction in manufacturing process and a decrease in waste according to cutting machining. For application to cutting tools, there has been targeted development of various types of coating tool materials that are high in high-temperature hardness for an increase in tool life and that have both hardness and toughness.

Conventionally, a substrate surface has been covered with a nitride or carbonitride coating film containing Ti and Al as main components, as the type of a coating tool material (PTL 1 and PTL 2). However, the cutting edge temperature of a cutting tool in a cutting process tends to be higher because of, for example, an increase in cutting speed for dry machining with no cutting oil and for an enhancement in machining efficiency, from the viewpoint of the above-mentioned SDGs and global environmental conservation, and an increase in cutting of a heat-resistant alloy, a titanium alloy and the like, each called hard-to-cut material, particularly in the fields of airplane and medical care due to diversity of a workpiece. In other words, a higher cutting edge temperature causes an extremely shorter life of a cutting tool.

Accordingly, there is a demand for a cutting tool that can exhibit an excellent tool life even under such severe cutting conditions.

Advantageous Effect of the Present Disclosure

According to the present disclosure, a cutting tool having a long tool life particularly even in cutting machining to be carried out under a high cutting edge temperature condition can be provided.

DESCRIPTION OF EMBODIMENTS

First, embodiments of the present disclosure will be listed and described.

(1) A cutting tool according to one aspect of the present disclosure is a cutting tool comprising a substrate and a coating film disposed on the substrate, wherein the coating film includes a first layer, the first layer is composed of an alternate layer where a first unit layer and a second unit layer are alternately stacked, the first unit layer is composed of $Ti_{1-a-b}Al_aCe_bN$, a is 0.350 or more and 0.650 or less, b is 0.001 or more and 0.100 or less, the second unit layer is composed of $Al_cCr_{1-c}N$, c is 0.40 or more and 0.75 or less, and a and c satisfy a relationship of c>a.

According to the present disclosure, a cutting tool having a long tool life particularly even in cutting machining to be carried out under a high cutting edge temperature condition can be provided.

(2) In (1) described above, in the first unit layer and the second unit layer adjacent to the first unit layer, a ratio $\lambda 2/\lambda 1$ of a thickness $\lambda 2$ of the second unit layer to a thickness $\lambda 1$ of the first unit layer is preferably 1 or more and 5 or less. Thus, a cutting tool having a longer tool life particularly even in cutting machining to be carried out under a high cutting edge temperature condition can be provided.

(3) In (1) or (2) described above, preferably, an average thickness of the first unit layer is 0.002 μm or more and 0.2 μm or less, and an average thickness of the second unit layer is 0.002 μm or more and 0.2 μm or less. Thus, a cutting tool having a longer tool life particularly even in cutting machining to be carried out under a high cutting edge temperature condition can be provided.

(4) In any of (1) to (3) described above, preferably, the coating film further includes a second layer disposed between the substrate and the first layer, and a composition of the second layer is the same as a composition of the first unit layer or a composition of the second unit layer. Thus, a cutting tool having a longer tool life particularly even in cutting machining to be carried out under a high cutting edge temperature condition can be provided.

(5) In (4) described above, preferably, the composition of the second layer is the same as the composition of the first unit layer, and a thickness of the second layer is larger than a thickness of the first unit layer. Thus, a cutting tool having a longer tool life particularly even in cutting machining to be carried out under a high cutting edge temperature condition can be provided.

(6) In (4) described above, preferably, the composition of the second layer is the same as the composition of the second unit layer, and a thickness of the second layer is larger than a thickness of the second unit layer. Thus, a cutting tool having a longer tool life particularly even in cutting machining to be carried out under a high cutting edge temperature condition can be provided.

(7) In any of (1) to (6) described above, preferably, the coating film further includes a third layer provided on the first layer opposite to the substrate, and the third layer is composed of TiAlCeCN. Thus, a cutting tool having a longer tool life particularly even in cutting machining to be carried out under a high cutting edge temperature condition can be provided.

(8) A cutting tool according to another aspect of the present disclosure is a cutting tool comprising a substrate and a coating film disposed on the substrate, wherein the coating film includes a first A layer, the first A layer is composed of an alternate layer where a first unit layer and a third unit layer are alternately stacked, the first unit layer is composed of $Ti_{1-a-b}Al_aCe_bN$, a is 0.350 or more and 0.650 or less, b is 0.001 or more and 0.100 or less, the third unit layer is composed of $Al_dCr_{1-d-e}M_eN$, M is silicon or boron, d is 0.40 or more and 0.75 or less, e is more than 0 and 0.05 or less, and a and d satisfy a relationship of d>a.

According to the present disclosure, a cutting tool having a long tool life particularly even in cutting machining to be carried out under a high cutting edge temperature condition can be provided.

(9) In (8) described above, in the first unit layer and the third unit layer adjacent to the first unit layer, a ratio $\lambda 3/\lambda 1$ of a thickness $\lambda 3$ of the third unit layer to a thickness $\lambda 1$ of the first unit layer is preferably 1 or more and 5 or less. Thus, a cutting tool having a longer tool life particularly even in cutting machining to be carried out under a high cutting edge temperature condition can be provided.

(10) In (8) or (9) described above, M is preferably silicon. Thus, a cutting tool having a longer tool life particularly even in cutting machining to be carried out under a high cutting edge temperature condition can be provided.

(11) In (8) or (9) described above, M is preferably boron. Thus, a cutting tool having a longer tool life particularly even in cutting machining to be carried out under a high cutting edge temperature condition can be provided.

(12) In any of (8) to (11) described above, preferably, an average thickness of the first unit layer is 0.002 μm or more and 0.2 μm or less, and an average thickness of the third unit layer is 0.002 μm or more and 0.2 μm or less. Thus, a cutting tool having a longer tool life particularly even in cutting machining to be carried out under a high cutting edge temperature condition can be provided.

(13) In any of (8) to (12) described above, preferably, the coating film further includes a second layer disposed between the substrate and the first A layer, and a composition of the second layer is the same as a composition of the first unit layer or a composition of the third unit layer. Thus, a cutting tool having a longer tool life particularly even in cutting machining to be carried out under a high cutting edge temperature condition can be provided.

(14) In (13) described above, preferably, the composition of the second layer is the same as the composition of the first unit layer, and a thickness of the second layer is larger than a thickness of the first unit layer.

Thus, a cutting tool having a longer tool life particularly even in cutting machining to be carried out under a high cutting edge temperature condition can be provided.

(15) In (13) described above, preferably, the composition of the second layer is the same as the composition of the third unit layer, and a thickness of the second layer is larger than a thickness of the third unit layer.

Thus, a cutting tool having a longer tool life particularly even in cutting machining to be carried out under a high cutting edge temperature condition can be provided.

(16) In any of (8) to (15) described above, preferably, the coating film further includes a third layer provided on the first A layer opposite to the substrate, and the third layer is composed of TiAlCeCN. Thus, a cutting tool having a longer tool life particularly even in cutting machining to be carried out under a high cutting edge temperature condition can be provided.

DETAIL OF EMBODIMENTS OF THE PRESENT DISCLOSURE

Specific examples of a cutting tool of one embodiment of the present disclosure (hereinafter, also designated as "the present embodiment".) are described below with reference to drawings. The same reference symbol in the drawings in the present disclosure represents the same section or any corresponding section thereof. A dimensional relationship among a length, a width, a thickness, a depth, and the like is appropriately modified for clarification and simplification of the drawings, and does not necessarily represent an actual dimensional relationship.

The designation "A to B" herein means to include the upper limit and the lower limit of a range (namely, A or more and B or less), and when no unit is designated with A and any unit is designated with only B, the unit of A is the same as the unit of B.

When a compound or the like is herein represented by a chemical formula, the atomic ratio thereof, if not particularly limited, encompasses any atomic ratio conventionally known, and should not be necessarily limited to only any ratio falling within the stoichiometric range. For example, when "TiAlCeN" is designated, the ratio of the numbers of atoms constituting TiAlCeN encompasses any atomic ratio conventionally known.

Embodiment 1: Cutting Tool 1

A cutting tool according to one embodiment of the present disclosure is described with reference to FIG. 1 to FIG. 5.

One embodiment of the present disclosure (hereinafter, also designated as "Embodiment 1".) relates to a cutting tool 1 comprising a substrate 2 and a coating film 3 disposed on substrate 2, wherein coating film 3 includes first layers 13 and 13', first layers 13 and 13' are each composed of an alternate layer where a first unit layer 12 and a second unit layer 15 are alternately stacked, first unit layer 12 is composed of $Ti_{1-a-b}Al_aCe_bN$, a is 0.350 or more and 0.650 or less, b is 0.001 or more and 0.100 or less, second unit layer 15 is composed of $Al_cCr_{1-c}N$, c is 0.40 or more and 0.75 or less, and a and c satisfy a relationship of c>a.

According to the present disclosure, cutting tool 1 having a long tool life particularly even in cutting machining to be carried out under a high cutting edge temperature condition can be provided. The reason for this is presumed as follows.

(a) In cutting tool 1, coating film 3 includes first layers 13 and 13', and first layers 13 and 13' are each composed of an alternate layer where first unit layer 12 and second unit layer 15 are alternately stacked. Thus, the grain boundary is decreased in the first layers, thereby enabling "cracking resistance" and "oxidation resistance" of first layers 13 and 13' to be enhanced and enabling "crack development" at the interface between first unit layer 12 and second unit layer 15 to be suppressed.

(b) As described above, coating film 3 includes first layers 13 and 13', and first layers 13 and 13' are each composed of an alternate layer where first unit layer 12 and second unit layer 15 are alternately stacked. In addition, first unit layer 12 is composed of $Ti_{1-a-b}Al_aCe_bN$, and second unit layer 15 is composed of, $Al_cCr_{1-c}N$. $Ti_{1-a-b}Al_aCe_bN$ hardly leads to spinodal decomposition at high temperature, as compared with $Al_cCr_{1-c}N$. Therefore, first unit layer 12 tends to be suppressed in deterioration in hardness, increased in compressive residual stress, and excellent in chipping resistance. On the other hand, $Al_cCr_{1-c}N$ tends to be low in compressive residual stress and have excellent "heat insulation ability" (in other words, "heat resistance"), as compared with $Ti_{1-a-b}Al_aCe_bN$. First layers 13 and 13', in which first unit layer 12 and second unit layer 15 are alternately stacked, thus have both high "hardness" due to first unit layer 12 and excellent "heat resistance" due to second unit layer 15, and allow small compressive residual stress due to second unit layer 15 to be complemented with large compressive residual stress due to first unit layer 12. Accordingly, first layers 13 and 13' can be entirely enhanced in hardness, heat resistance, and compressive residual stress in a well-balanced manner.

(c) In cutting tool 1, first unit layer 12 is composed of $Ti_{1-a-b}Al_aCe_bN$, a is 0.350 or more and 0.650 or less, and b is 0.001 or more and 0.100 or less. Thus, Al is easily oxidized and therefore a dense oxide layer composed of $Al_2O_3$ is easily formed on a surface of first unit layer 12. Furthermore, Ce is low in standard energy of formation of oxide as compared with Al, and is thus more easily oxidized and more easily forms a dense oxide layer composed of $CeO_2$ on an outermost surface of first unit layer 12 than Al. Such an oxide layer not only can enhance "oxidation resistance" of coating film 3, but also can decrease reactivity with a workpiece and can reduce the coefficient of friction with a workpiece. The lattice constant of CeN is 5.01 Å which is larger than 4.23 Å being the lattice constant of TiN and 4.12 Å being the lattice constant of AlN, and thus strain is introduced to first unit layer 12 to refine the texture of first unit layer 12. As a result, first unit layer 12 is increased in hardness and thus "wear resistance" of first unit layer 12 can be enhanced.

(d) In cutting tool 1, first unit layer 12 is composed of $Ti_{1-a-b}Al_aCe_bN$, . . . second unit layer 15 is composed of $Al_cCr_{1-c}N$, . . . a and c satisfy a relationship of c>a. The difference between the lattice constant of AlN and the lattice constant of CrN in second unit layer 15 is smaller than the difference between the lattice constant of TiN and the lattice constant of AlN in first unit layer 12, to result in a tendency to allow second unit layer 15 to be easily high in content of Al as compared with first unit layer 12. Therefore, the content of Al in second unit layer 15 can be high to result in an increase in content of Al contained in entire first layers 13 and 13'. As a result, "heat resistance" and "oxidation resistance" of first layers 13 and 13' can be enhanced.

In other words, according to the present disclosure, cutting tool 1 can simultaneously have excellent "cracking resistance", excellent "oxidation resistance", excellent "effect of suppression of crack development", high "hardness", excellent "wear resistance", and excellent "heat resistance", and therefore cutting tool 1 having a long tool life particularly even in cutting machining to be carried out under a high cutting edge temperature condition can be provided.

«Cutting Tool»

As illustrated in FIG. 1, cutting tool 1 according to one embodiment of the present disclosure includes substrate 2, and coating film 3 disposed on substrate 2. While coating film 3 preferably covers the entire face of substrate 2, a case where one portion of substrate 2 is not covered with coating film 3 and a case where the configuration of coating film 3 is partially different also do not depart from the scope of the present embodiment. In the case where one portion of substrate 2 is not covered with coating film 3, coating film 3 is preferably disposed so as to cover at least a portion of substrate 2, the portion involving in cutting. Herein, the portion of substrate 2, involving in cutting, means, while depends on the size and shape of substrate 2, a region of substrate 2, the region being surrounded by a cutting edge ridgeline, and a virtual face where the distance from the cutting edge ridgeline toward substrate 2 along with the perpendicular line of the tangent to the cutting edge ridgeline is, for example, any of 5 mm, 3 mm, 2 mm, 1 mm, and 0.5 mm.

Cutting tool 1 of the present embodiment can be suitably used as cutting tool 1 for drills, end mills, indexable cutting inserts for drills, indexable cutting inserts for end mills, indexable cutting inserts for milling, indexable cutting inserts for turning, metal saws, gear cutting tools, reamers, taps, and the like.

<Substrate>

Any one conventionally known as this type of substrate 2 can be used as substrate 2. For example, the substrate is preferably any of cemented carbide (WC-based cemented carbide, cemented carbide containing WC and Co, cemented carbide to which carbonitride of Ti, Ta, Nb or the like is further added, or the like), cermet (one containing TiC, TiN, TiCN or the like as a main component), high-speed steel, ceramics (titanium carbide, silicon carbide, silicon nitride, aluminum nitride, aluminum oxide, or the like), a cubic boron nitride sintered material, or a diamond sintered material.

In particular, WC-based cemented carbide, or cermet (in particular, TiCN-based cermet) is preferably selected among such various substrates 2. Such substrate 2 is excellent in balance between hardness and strength particularly at high temperature, and thus, when used as substrate 2 of cutting tool 1, can contribute to an increase in life of cutting tool 1.

<Coating Film>

Coating film 3 of Embodiment 1 includes first layers 13 and 13'. Coating film 3 covers substrate 2, and thus has the action of enhancing various characteristics such as wear resistance and chipping resistance of cutting tool 1 and resulting in an increase in life of cutting tool 1. Herein, coating film 3 can include, in addition to first layers 13, 13', "other layer" described below.

The entire thickness of coating film 3 is preferably 0.5 µm or more and 15 µm or less. If the entire thickness is less than 0.5 µm, the thickness of coating film 3 is so thin that the life of cutting tool 1 tends to be decreased. On the other hand, if the entire thickness is more than 15 µm, coating film 3 is easily chipped in an early stage of cutting, resulting in a tendency to decrease the life of cutting tool 1. The entire thickness of coating film 3 can be measured by observation of a cross section of coating film 3 with SEM (scanning electron microscope). Specifically, the observation magnification and the observation area of a cross section sample are respectively set to 5000 to 10000 times and 100 to 500 µm$^2$, the thickness width is measured at three positions in one field of view, and the average value is defined as the "thickness". The same also applies to the thickness of each layer described below, unless particularly noted.

The absolute value of the compressive residual stress of coating film 3 is preferably 6 GPa or less. The compressive residual stress of coating film 3 refers to one internal stress (inherent strain) present in entire coating film 3, which is represented by a minus "−" number (unit: "GPa" used in the present embodiment). Thus, a concept where the compressive residual stress is large indicates that the absolute value of the numerical value is larger, and a concept where the compressive residual stress is small indicates that the absolute value of the numerical value is smaller. In other words, an absolute value of the compressive residual stress, of 6 GPa or less, means that a preferable compressive residual stress of coating film 3 is −6 GPa or more and 0 GPa or less.

The compressive residual stress of coating film 3, when exceeds 0 GPa, serves as tensile stress, and thus crack development generated from an outermost surface of coating film 3 tends to be hardly suppressed. In this regard, the absolute value of the compressive residual stress, when exceeds 6 GPa, is so large that coating film 3 is peeled particularly from an edge portion of cutting tool 1 before the start of cutting to cause a shorter life of cutting tool 1.

The compressive residual stress of coating film 3 can be measured with an X-ray residual stress apparatus according to a sin2ψ method (see pages 54 to 66 of "X-ray Stress Measurement Method" (The Society of Materials Science, Japan, 1981, published by Yokendo Co., Ltd.)).

The crystal structure of coating film 3 is preferably cubic. When the crystal structure of coating film 3 is cubic, the hardness of coating film 3 is enhanced. Accordingly, the crystal structure of each layer in coating film 3 is preferably cubic. Herein, the crystal structures of coating film 3 and each layer in coating film 3 can be analyzed with an X-ray diffraction apparatus known in the art.

The hardness of coating film 3 is preferably 30 GPa or more and 55 GPa or less, more preferably 35 GPa or more and 50 GPa or less. According to this, coating film 3 has sufficient hardness. Herein, the hardness of entire coating film 3 can be measured by a nano indenter method (Nano Indenter XP manufactured by MTS Systems Corporation). Specifically, the hardness is obtained by measuring the hardness at three points on a surface of coating film 3 at a measurement load of 10 mN (1 gf) by a method according to ISO14577, and determining the average value as "hardness".

<First Layer>

First layers 13 and 13' of the present embodiment are each composed of an alternate layer where first unit layer 12 and second unit layer 15 are alternately stacked. Thus, "cracking resistance" and "oxidation resistance" of first layers 13 and 13' can be enhanced and "crack development" can be suppressed at the interface between first unit layer 12 and second unit layer 15, and therefore not only "cracking resistance" and "oxidation resistance" of coating film 3 can be enhanced, but also "crack development" of coating film 3 can be suppressed. Herein, the "first layers 13 and 13' each composed of an alternate layer where first unit layer 12 and second unit layer 15 are alternately stacked" can be confirmed by the difference in contrast in observation of a cross section of coating film 3 with a TEM (transmission electron microscope).

The thicknesses of first layers 13 and 13' are preferably 0.5 µm or more and 15 µm or less. The thicknesses of first layers 13 and 13', if less than 0.5 µm, result in a tendency not to enable wear resistance to be sufficiently exhibited in continuous machining, and, if more than 15 μm, result in a tendency to cause chipping resistance to be hardly stable in intermittent cutting.

The thicknesses of first layers 13 and 13' can be measured by observation of a cross section of coating film 3 with a TEM (transmission electron microscope). Specifically, the thicknesses of first layers 13 and 13' can be measured by irradiating a flaked sample with electron beam, imaging an electron penetrating through the sample and an electron scattered and observing them at a high magnification.

(Composition of First Unit Layer and Composition of Second Unit Layer)

First unit layer 12 is composed of $Ti_{1-a-b}Al_aCe_bN$, a is 0.350 or more and 0.650 or less, and b is 0.001 or more and 0.100 or less. Thus, "oxidation resistance" and "wear resistance" of coating film 3 can be enhanced. a is preferably 0.400 or more, more preferably 0.450 or more, further preferably 0.500 or more. a is preferably 0.650 or less, more preferably 0.600 or less, further preferably 0.550 or less. a is preferably 0.400 or more and 0.650 or less, more preferably 0.450 or more and 0.600 or less, further preferably 0.500 or more and 0.055 or less. b is preferably 0.005 or more, more preferably 0.01 or more, further preferably 0.015 or more. b is preferably 0.070 or less, more preferably 0.050 or less, further preferably 0.020 or less. b is preferably 0.005 or more and 0.050 or less, more preferably 0.007 or more and 0.030 or less, further preferably 0.010 or more and 0.020 or less. Herein, the "composed of $Ti_{1-a-b}Al_aCe_bN$" means that inevitable impurities can be contained in addition to $Ti_{1-a-b}Al_aCe_bN$ as long as the effects of the present disclosure are exerted. Examples of the inevitable impurities include oxygen and carbon. The content of the entire inevitable impurities in first unit layer 12 is preferably more than 0% by atom and less than 1% by atom. Herein, the "% by atom" means the proportion (%) of the number of atoms to the total number of atoms constituting the layer. The proportion (%) of the number of atoms to the total number of atoms constituting the layer is determined by the same method as "Measurement method of a and b" described below. It is here confirmed that, as long as measurement is made with the same cutting tool 1, no variation in measurement results is found even if a measurement position is arbitrarily selected.

a and b are determined by elemental analysis with transmission electron microscope (TEM) observation of a sample cross section. Specifically, these are determined by measuring the energy and the number of occurrences of characteristic X-ray occurring in irradiation of a sample obtained by flaking of a thin film cross section, with electron beam by use of EDS (Energy Dispersive X-ray Spectroscopy) attached to TEM, and performing elemental analysis. It is here confirmed that, as long as measurement is made with the same cutting tool 1, no variation in measurement results is found even if a measurement position is arbitrarily selected.

Second unit layer 15 is composed of $Al_cCr_{1-c}N$. Thus, AlCrN is excellent in balance among heat insulation resistance (in other words, "heat resistance"), "oxidation resistance" and "toughness", thereby enabling coating film 3 to have simultaneously have excellent "heat resistance", excellent "oxidation resistance" and excellent "toughness". Herein, the "composed of $Al_cCr_{1-c}N$" means that inevitable impurities can be contained in addition to $Al_cCr_{1-c}N$ as long as the effects of the present disclosure are exerted. Examples of the inevitable impurities include oxygen and carbon. The content of the entire inevitable impurities in second unit layer 15 is preferably more than 0% by atom and less than 1% by atom. Herein, the "% by atom" means the proportion (%) of the number of atoms to the total number of atoms constituting the layer. The proportion (%) of the number of atoms to the total number of atoms constituting the layer is determined by the same method as the "Measurement method of a and b". It is here confirmed that, as long as measurement is made with the same cutting tool 1, no variation in measurement results is found even if a measurement position is arbitrarily selected.

c is 0.40 or more and 0.75 or less. Thus, the crystal structure of second unit layer 15 is cubic to thereby lead to an increase in hardness of second unit layer 15, resulting in an enhancement in "wear resistance" of second unit layer 15. c is preferably 0.50 or more, more preferably 0.55 or more, further preferably 0.60 or more. c is preferably 0.75 or less, more preferably 0.70 or less, further preferably 0.65 or less. c is preferably 0.50 or more and 0.75 or less, more preferably 0.55 or more and 0.70 or less, further preferably 0.60 or more and 0.65 or less.

c is determined by the same method as the measurement method of a and b. It is here confirmed that, as long as measurement is made with the same cutting tool 1, no variation in measurement results is found even if a measurement position is arbitrarily selected.

a and c satisfy a relationship of c>a. Thus, "heat resistance" and "oxidation resistance" of coating film 3 can be enhanced.

(Average Thickness of First Unit Layer and Average Thickness of Second Unit Layer)

The average thickness of first unit layer 12 is 0.002 μm or more and 0.2 μm or less, and the average thickness of second unit layer 15 is preferably 0.002 μm or more and 0.2 μm or less. According to this, crack development occurring on a surface of coating film 3 can be further suppressed. The lower limit of the average thickness of first unit layer 12 is preferably 0.002 μm or more, more preferably 0.005 μm or more, further preferably 0.01 μm or more. The upper limit of the average thickness of first unit layer 12 is preferably 0.2 μm or less, more preferably 0.15 μm or less, further preferably 0.1 μm or less. The average thickness of first unit layer 12 is more preferably 0.005 μm or more and 0.15 μm or less, further preferably 0.01 μm or more and 0.1 μm or less. The lower limit of the average thickness of second unit layer 15 is preferably 0.002 μm or more, more preferably 0.005 μm or more, further preferably 0.01 μm or more. The upper limit of the average thickness of second unit layer 15 is preferably 0.2 μm or less, more preferably 0.15 μm or less, further preferably 0.1 μm or less. The average thickness of second unit layer 15 is more preferably 0.005 μm or more and 0.15 μm or less, further preferably 0.01 μm or more and 0.1 μm or less.

The average thickness of first unit layer 12 and the average thickness of second unit layer 15 can be determined by the same method as the measurement method of the thicknesses of first layers 13 and 13'.

Figure 5:
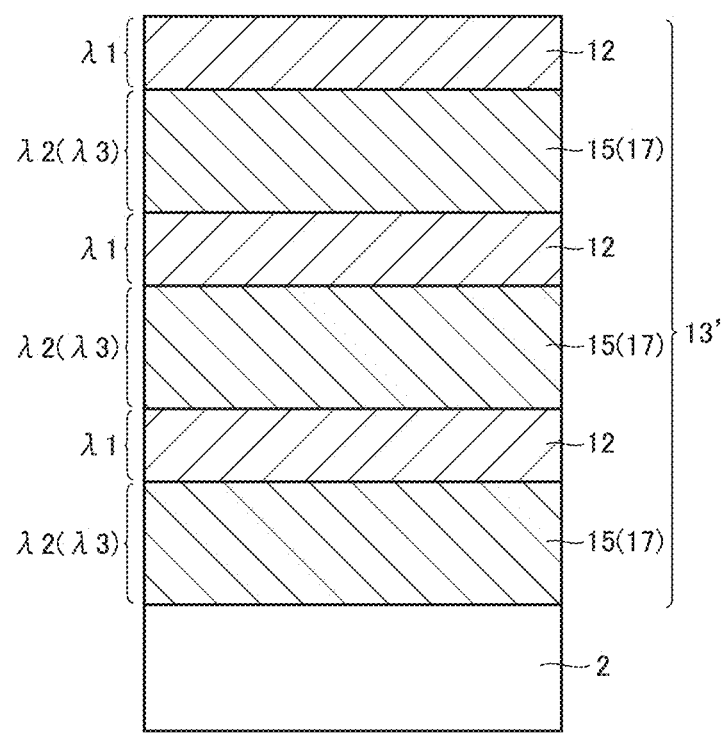
FIG. 5 is a view for describing one example of the thickness ratio of a first unit layer and a second unit layer.

In first unit layer 12 and second unit layer 15 adjacent to first unit layer 12, a ratio λ2/λ1 of a thickness λ2 of second unit layer 15 to a thickness λ1 of first unit layer 12 is preferably 1 or more and 5 or less preferably (FIG. 5). Second unit layer 15 is low in "heat conductivity", and thus second unit layer 15 has the property of hardly transferring heat generated in cutting, to substrate 2. Therefore, when the proportion of second unit layer 15 in first layers 13 and 13' is relatively increased, the amount of Al in coating film 3 is increased and thus heat insulation ability (in other words, "heat resistance") of entire cutting tool 1 is enhanced, and therefore "wear resistance" can be enhanced particularly even in cutting machining to be carried out under a high cutting edge temperature condition. $\lambda 2/\lambda 1$ is preferably 1 or more, more preferably 1.5 or more, further preferably 2 or more. $\lambda 2/\lambda 1$ is preferably 5 or less, more preferably 4 or less, further preferably 3 or less. $\lambda 2/\lambda 1$ is preferably 1 or more and 5 or less, more preferably 1.5 or more and 4 or less, further preferably 2 or more and 3 or less.

The number of layers stacked with respect to each of first unit layer 12 and second unit layer 15 in first layers 13 and 13' is preferably 10 or more and 500 or less. According to this, the "effect of enhancing hardness and compressive residual stress in a well-balanced manner by stacking of first unit layer 12 and second unit layer 15" tends to be easily obtained. The number of layers stacked with respect to each of first unit layer 12 and second unit layer 15 in first layers 13 and 13' is more preferably 100 or more and 400 or less, further preferably 200 or more and 350 or less.

The number of layers stacked with respect to each of first unit layer 12 and second unit layer 15 in first layers 13 and 13' can be determined from measurement by observation of a cross section of coating film 3 with a TEM (transmission electron microscope). Specifically, the number of layers stacked with respect to each of first unit layer 12 and second unit layer 15 can be measured by irradiating a flaked sample with electron beam, imaging an electron penetrating through the sample and an electron scattered and observing them at a high magnification.

<Other Layer>

Examples of other layer include second layer 16 (FIGS. 3 and 4) described below and third layer 14 (FIGS. 1 to 4) described below. Coating film 3 may also further include an intermediate layer (not illustrated) between second layer 16 and first layers 13 and 13', or between first layers 13 and 13', and third layer 14.

(Second Layer)

Figure 3:
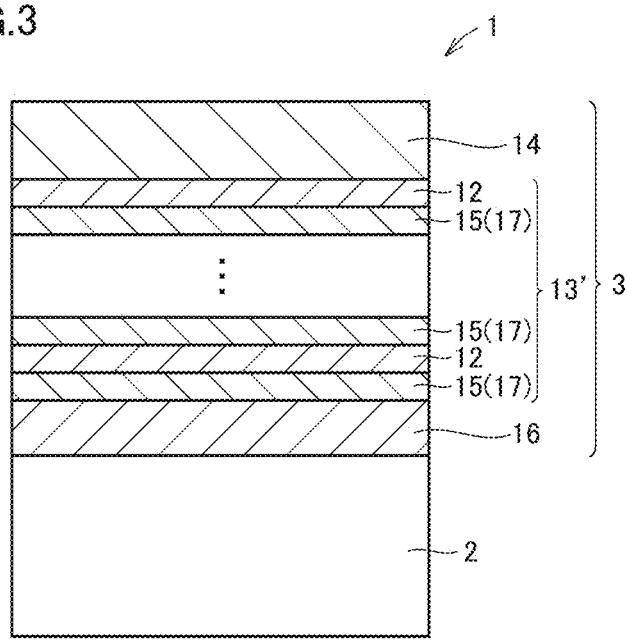
FIG. 3 is a schematic enlarged cross-sectional view of a cutting tool according to another different embodiment of the present disclosure.
Figure 4:
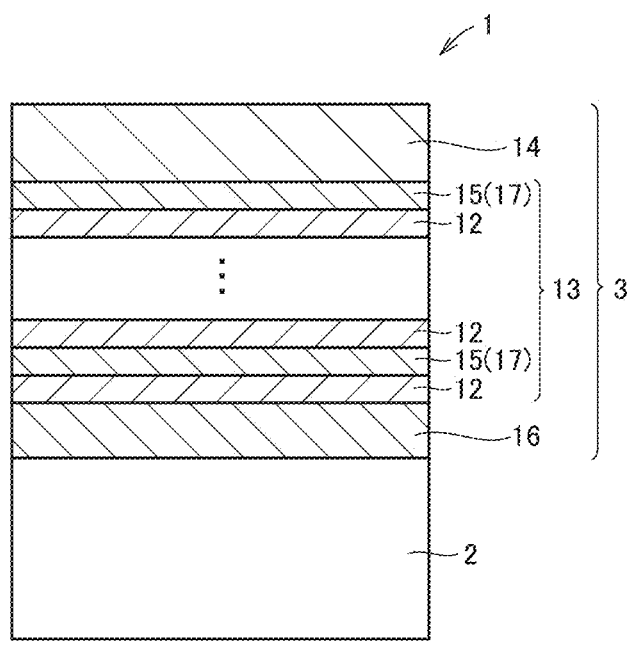
FIG. 4 is a schematic enlarged cross-sectional view of a cutting tool according to still another different embodiment of the present disclosure.

Preferably, coating film 3 further includes second layer 16 disposed between substrate 2 and first layers 13 and 13', and the composition of second layer 16 is the same as the composition of first unit layer 12 or the composition of second unit layer 15 (FIG. 3 and FIG. 4). Thus, close adhesion between substrate 2 and coating film 3 can be enhanced.

When the composition of second layer 16 is the same as the composition of first unit layer 12, oxidation starting from the interface between substrate 2 and coating film 3 can be suppressed even if substrate 2 is exposed in an early stage of cutting.

When the composition of second layer 16 is the same as the composition of first unit layer 12 the thickness of second layer 16 is preferably larger than the thickness of first unit layer 12. Thus, close adhesion between substrate 2 and coating film 3 can be more enhanced. In addition, even if substrate 2 is exposed in an early stage of cutting, oxidation starting from the interface between substrate 2 and coating film 3 can be further suppressed. Herein, "the thickness of second layer 16 is larger than the thickness of first unit layer 12" can be restated as "the thickness of second layer 16 is more than 1.0 times the thickness of first unit layer 12". The thickness of second layer 16 is preferably 2.0 times or more, more preferably 4.0 times or more, further preferably 10.0 times or more the thickness of first unit layer 12. The thickness of second layer 16 is preferably 500 times or less, more preferably 120 times or less, further preferably 50 times or less the thickness of first unit layer 12. The thickness of second layer 16 is preferably 2.0 times or more and 500 times or less, more preferably 4.0 times or more and 120 times or less, further preferably 10.0 times or more and 50 times or less the thickness of first unit layer 12.

When the composition of second layer 16 is the same as the composition of first unit layer 12, the thickness of second layer 16 is preferably 0.1 μm or more. If the thickness of second layer 16 is less than 0.1 μm, the effect of suppression of oxidation starting from the interface between substrate 2 and coating film 3 by allowing second layer 16 to be the same in composition as first unit layer 12 tends to be hardly obtained. When the composition of second layer 16 is the same as the composition of first unit layer 12, the thickness of second layer 16 is more preferably 0.3 μm or more, further preferably 0.4 μm or more. The upper limit value of the thickness of second layer 16 is not particularly limited, and if more than 2 μm, a crystal grain is enlarged to cause the occurrence of a grain boundary, resulting in a tendency to hardly further enhance the above effect of suppression of oxidation. Accordingly, the thickness of second layer 16 is preferably 2 μm or less in consideration of the cost advantage.

When the composition of second layer 16 is the same as the composition of first unit layer 12, first unit layer 12 (FIG. 4) or second unit layer 15 (FIG. 3), of first layers 13 and 13', may be stacked directly on second layer 16 having the same composition as that of first unit layer 12. When the composition of second layer 16 is the same as the composition of first unit layer 12 and first unit layer 12 of first layers 13 and 13' is stacked directly on second layer 16, second layer 16 and first unit layer 12 of first layers 13 and 13' have a continuous crystal structure.

When the composition of second layer 16 is the same as the composition of second unit layer 15, second unit layer 15 tends to be small in stress, and thus peeling resistance of coating film 3 can be enhanced particularly in intermittent machining where a load is repeatedly applied to a cutting edge, such as milling or end milling.

When the composition of second layer 16 is the same as the composition of second unit layer 15, the thickness of second layer 16 is preferably larger than the thickness of second unit layer 15. Thus, peeling resistance of coating film 3 can be further enhanced particularly in intermittent machining where a load is repeatedly applied to a cutting edge, such as milling or end milling. Herein, "the thickness of second layer 16 is larger than the thickness of second unit layer 15" can be restated as "the thickness of second layer 16 is more than 1.0 times the thickness of second unit layer 15". The thickness of second layer 16 is preferably 2.0 times or more, more preferably 4.0 times or more, further preferably 10.0 times or more the thickness of second unit layer 15. The thickness of second layer 16 is preferably 500 times or less, more preferably 120 times or less, further preferably 50 times or less the thickness of second unit layer 15. The thickness of second layer 16 is preferably 2.0 times or more and 500 times or less, more preferably 4.0 times or more and 120 times or less, further preferably 10.0 times or more and 50 times or less the thickness of second unit layer 15.

When the composition of second layer 16 is the same as the composition of second unit layer 15, the thickness of second layer 16 is preferably 0.1 μm or more. If the thickness of second layer 16 is less than 0.1 μm, the effect of enhancing peeling resistance by allowing second layer 16 to be the same in composition as second unit layer 15 tends to be hardly obtained. When the composition of second layer 16 is the same as the composition of second unit layer 15, the thickness of second layer 16 is more preferably 0.3 μm or more, further preferably 0.4 μm or more. The upper limit value of the thickness of second layer 16 is not particularly limited, and if more than 2 μm, a more enhancement in peeling resistance described above tends not to be observed. Accordingly, the thickness of second layer 16 is preferably 2 μm or less in consideration of the cost advantage.

When the composition of second layer 16 is the same as the composition of second unit layer 15, first unit layer 12 (FIG. 4) or second unit layer 15 (FIG. 3), of first layers 13 and 13', may be stacked directly on second layer 16 having the same composition as that of second unit layer 15. When the composition of second layer 16 is the same as the composition of second unit layer 15 and second unit layer 15 of first layers 13 and 13' is stacked directly on second layer 16, second layer 16 and second unit layer 15 of first layers 13 and 13' have a continuous crystal structure.

(Third Layer)

Preferably, coating film 3 further includes third layer 14 provided on first layers 13 and 13' opposite to substrate 2, and third layer 14 is composed of TiAlCeCN (FIGS. 1 to 4). Thus, the coefficient of friction of coating film 3 can be reduced to result in an increase in life of cutting tool 1.

In general, carbonitride tends to be lower in coefficient of friction to a workpiece, than nitride. Such a reduction in coefficient of friction is considered to be due to contribution of a carbon atom. When coating film 3 includes third layer 14, the coefficient of friction of coating film 3 to a workpiece is reduced to result in an increase in life of cutting tool 1.

The compositional ratio of N and C in third layer 14 can be adjusted to thereby allow a predetermined color to be imparted. Thus, designability and discrimination can be imparted to the appearance of cutting tool 1, and the tool is commercially useful.

The thickness of third layer 14 is preferably 0.1 μm or more. If the thickness of third layer 14 is less than 0.1 μm, the effect of imparting lubricability by third layer 14 tends to be hardly obtained. In this regard, the upper limit value of the thickness of third layer 14 is not particularly limited, and if more than 2 μm, the above effect of imparting lubricability tends not to be able to be further enhanced. Accordingly, the thickness of third layer 14 is preferably 2 μm or less in consideration of the cost advantage.

(Intermediate Layer)

The intermediate layer is a layer disposed between second layer 16 and first layers 13 and 13', or between first layers 13 and 13' and third layer 14. Examples of the intermediate layer include TiAlCeN, AlCrN, AlCrBN, and AlCrSiN. The thickness of the intermediate layer can be 0.1 μm or more and 2 μm or less, 0.3 μm or more and 1.5 μm or less, or 0.4 μm or more and 1.0 μm or less.

Embodiment 2: Cutting Tool 2

A cutting tool according to another embodiment of the present disclosure is described with reference to FIG. 1 to FIG. 5.

Another embodiment of the present disclosure (hereinafter, also designated as "Embodiment 2".) relates to
 a cutting tool comprising a substrate and a coating film disposed on the substrate, wherein
 the coating film includes a first A layer,
 the first A layer is composed of an alternate layer where a first unit layer and a third unit layer are alternately stacked,
 the first unit layer is composed of $Ti_{1-a-b}Al_aCe_bN$,
 a is 0.350 or more and 0.650 or less,
 b is 0.001 or more and 0.100 or less,
 the third unit layer is composed of $Al_dCr_{1-d-e}M_eN$,
 M is silicon or boron,
 d is 0.40 or more and 0.75 or less,
 e is more than 0 and 0.05 or less, and
 a and d satisfy a relationship of d>a.

Cutting tool 1 of Embodiment 2 has the same configuration as in Embodiment 1 except that "coating film 3 includes "first A layers 13 and 13'"", "the composition of second layer 16 is preferably the same as the composition of first unit layer 12 or the composition of "a third unit layer 17"", and "coating film 3 further includes third layer 14 provided on "first A layers 13 and 13'" opposite to substrate 2, and third layer 14 is preferably composed of TiAlCeCN". Hereinafter, "first A layers 13 and 13'" and the "second layer" will be described.

<First A Layer>

First A layers 13 and 13' of the present embodiment are each composed of an alternate layer where first unit layer 12 and third unit layer 17 are alternately stacked. Thus, "cracking resistance" and "oxidation resistance" of first A layers 13 and 13' can be enhanced and "crack development" can be suppressed at the interface between first unit layer 12 and third unit layer 17, and therefore not only "cracking resistance" and "oxidation resistance" of coating film 3 can be enhanced, but also "crack development" in coating film 3 can be suppressed. Herein, the "first A layers 13 and 13' each composed of an alternate layer where first unit layer 12 and third unit layer 17 are alternately stacked" can be confirmed by the difference in contrast in observation of a cross section of coating film 3 with a TEM (transmission electron microscope).

The thicknesses of first A layers 13 and 13' are preferably 0.5 μm or more and 15 μm or less. The thicknesses of first A layers 13 and 13', if less than 0.5 μm, result in a tendency not to enable wear resistance to be sufficiently exhibited in continuous machining, and, if more than 15 μm, result in a tendency to cause chipping resistance to be hardly stable in intermittent cutting.

The thicknesses of first A layers 13 and 13' can be determined from measurement by observation of a cross section of coating film 3 with a TEM (transmission electron microscope). Specifically, the thicknesses of first A layers 13 and 13' can be measured by irradiating a flaked sample with electron beam, imaging an electron penetrating through the sample and an electron scattered and observing them at a high magnification.

(Composition of First Unit Layer and Composition of Third Unit Layer)

First unit layer 12 is composed of $Ti_{1-a-b}Al_aCe_bN$, a is 0.350 or more and 0.650 or less, and b is 0.001 or more and 0.100 or less. Thus, "oxidation resistance" and "wear resistance" of coating film 3 can be enhanced. a is preferably 0.400 or more, more preferably 0.450 or more, further preferably 0.500 or more. a is preferably 0.640 or less, more preferably 0.600 or less, further preferably 0.550 or less. a is preferably 0.400 or more and 0.650 or less, more preferably 0.450 or more and 0.600 or less, further preferably 0.500 or more and 0.550 or less. b is preferably 0.005 or more, more preferably 0.007 or more, further preferably 0.010 or more. b is preferably 0.070 or less, more preferably 0.050 or less, further preferably 0.020 or less. b is preferably 0.005 or more and 0.050 or less, more preferably 0.007 or more and 0.030 or less, further preferably 0.010 or more and 0.020 or less. Herein, the "composed of $Ti_{1-a-b}Al_aCe_bN$" means that inevitable impurities can be contained in addition to $Ti_{1-a-b}Al_aCe_bN$ as long as the effects of the present disclosure are exerted. Examples of the inevitable impurities include oxygen and carbon. The content of the entire inevitable impurities in first unit layer 12 is preferably more than 0% by atom and less than 1% by atom. Herein, the "% by atom" means the proportion (%) of the number of atoms to the total number of atoms constituting the layer. The proportion (%) of the number of atoms to the total number of atoms constituting the layer is determined by the same method as "Measurement method of a and b" described below. It is here confirmed that, as long as measurement is made with the same cutting tool 1, no variation in measurement results is found even if a measurement position is arbitrarily selected.

a and b are determined by elemental analysis with transmission electron microscope (TEM) observation of a sample cross section. Specifically, these are determined by measuring the energy and the number of occurrences of characteristic X-ray occurring in irradiation of a sample obtained by flaking of a thin film cross section, with electron beam by use of EDS (Energy Dispersive X-ray Spectroscopy) attached to TEM, and performing elemental analysis. It is here confirmed that, as long as measurement is made with the same cutting tool 1, no variation in measurement results is found even if a measurement position is arbitrarily selected.

Third unit layer 17 is composed of $Al_dCr_{1-d-e}M_eN$, and M is silicon or boron. Thus, third unit layer 17 can simultaneously have excellent hardness and excellent oxidation resistance. While the mechanism is not clear in detail, the following mechanism is presumed.

When M is boron, the hardness of third unit layer 17 is increased by boron and the hardness of entire coating film 3 is increased. Boron oxide formed by oxidation of a surface of cutting tool 1 according to cutting densifies an oxide of Al in third unit layer 17, resulting in an enhancement in oxidation resistance of third unit layer 17. Furthermore, boron oxide has a low melting point, and thus serves as a lubricant during cutting and can suppress adhesion of a workpiece.

When M is silicon, the texture of third unit layer 17 is refined to lead to enhancements in hardness and oxidation resistance of third unit layer 17, resulting in enhancements in hardness and oxidation resistance of entire coating film 3.

Herein, the "composed of $Al_dCr_{1-d-e}M_eN$" means that inevitable impurities can be contained in addition to $Al_dCr_{1-d-e}M_eN$ as long as the effects of the present disclosure are exerted. Examples of the inevitable impurities include oxygen and carbon. The content of the entire inevitable impurities in each of first unit layer 12 and third unit layer 17 is preferably more than 0% by atom and less than 1% by atom. Herein, the "% by atom" means the proportion (%) of the number of atoms to the total number of atoms constituting the layer. The proportion (%) of the number of atoms to the total number of atoms constituting the layer is determined by the same method as the "Measurement method of a and b". It is here confirmed that, as long as measurement is made with the same cutting tool 1, no variation in measurement results is found even if a measurement position is arbitrarily selected.

d is 0.40 or more and 0.75 or less. Thus, the crystal structure of third unit layer 15 is cubic to thereby lead to an increase in hardness of third unit layer 15, resulting in an enhancement in "wear resistance" of third unit layer 15.

d is preferably 0.50 or more, more preferably 0.55 or more, further preferably 0.60 or more. c is preferably 0.75 or less, more preferably 0.70 or less, further preferably 0.65 or less. c is preferably 0.50 or more and 0.75 or less, more preferably 0.55 or more and 0.70 or less, further preferably 0.60 or more and 0.65.

e is more than 0 and 0.05 or less. Thus, hardness of first A layers 13 and 13' and oxidation resistance of first A layers 13 and 13' can be enhanced. e is preferably 0.002 or more, more preferably 0.005 or more, further preferably 0.01 or more. e is preferably 0.04 or less, more preferably 0.03 or less, further preferably 0.02 or less. e is preferably 0.002 or more and 0.05 or less, more preferably 0.005 or more and 0.03 or less, further preferably 0.01 or more and 0.02 or less.

d and e are determined by the same method as the "Measurement method of a and b". It is here confirmed that, as long as measurement is made with the same cutting tool 1, no variation in measurement results is found even if a measurement position is arbitrarily selected.

a and d satisfy a relationship of d>a. Thus, "heat resistance" and "oxidation resistance" of coating film 3 can be enhanced.

(Average Thickness of First Unit Layer and Average Thickness of Third Unit Layer)

The average thickness of first unit layer 12 is 0.002 μm or more and 0.2 μm or less, and the average thickness of third unit layer 17 is preferably 0.002 μm or more and 0.2 μm or less. According to this, crack development occurring on a surface of coating film 3 can be further suppressed. The lower limit of the average thickness of first unit layer 12 is preferably 0.002 μm or more, more preferably 0.005 μm or more, further preferably 0.01 μm or more. The upper limit of the average thickness of first unit layer 12 is preferably 0.2 μm or less, more preferably 0.15 μm or less, further preferably 0.1 μm or less. The average thickness of first unit layer 12 is more preferably 0.005 μm or more and 0.15 μm or less, further preferably 0.01 μm or more and 0.1 μm or less. The lower limit of the average thickness of third unit layer 17 is preferably 0.002 μm or more, more preferably 0.005 μm or more, further preferably 0.01 μm or more. The upper limit of the average thickness of third unit layer 17 is preferably 0.2 μm or less, more preferably 0.15 μm or less, further preferably 0.1 μm or less. The average thickness of third unit layer 17 is more preferably 0.005 μm or more and 0.15 μm or less, further preferably 0.01 μm or more and 0.1 μm or less.

The average thickness of first unit layer 12 and the average thickness of third unit layer 17 can be determined by the same method as the measurement method of the thicknesses of first A layers 13 and 13'.

In first unit layer 12 and third unit layer 17 adjacent to first unit layer 12, a ratio $\lambda 3/\lambda 1$ of a thickness $\lambda 3$ of third unit layer 17 to a thickness $\lambda 1$ of first unit layer 12 is preferably 1 or more and 5 or less (FIG. 5). Third unit layer 17 is low in "heat conductivity", and thus third unit layer 17 has the property of hardly transferring heat generated in cutting, to substrate 2. Therefore, when the proportion of third unit layer 17 in first A layers 13 and 13' is relatively increased, the amount of Al in coating film 3 is increased and thus heat insulation ability (in other words, "heat resistance") of entire cutting tool 1 is enhanced, and therefore "wear resistance" can be enhanced particularly even in cutting machining to be carried out under a high cutting edge temperature condition. $\lambda 3/\lambda 1$ is preferably 1 or more, more preferably 1.5 or more, further preferably 2 or more. $\lambda 3/\lambda 1$ is preferably 5 or less, more preferably 4 or less, further preferably 3 or less. $\lambda 3/\lambda 1$ is preferably 1 or more and 5 or less, more preferably 1.5 or more and 4 or less, further preferably 2 or more and 3 or less.

The number of layers stacked with respect to each of first unit layer 12 and third unit layer 17 in first A layers 13 and 13' is preferably 10 or more and 500 or less. According to this, the "effect of enhancing hardness and compressive residual stress in a well-balanced manner by stacking of first unit layer 12 and third unit layer 17" tends to be easily obtained. The number of layers stacked with respect to each of first unit layer 12 and third unit layer 17 in first A layers 13 and 13' is more preferably 100 or more and 400 or less, further preferably 200 or more and 350 or less.

The number of layers stacked with respect to each of first unit layer 12 and third unit layer 17 in first A layers 13 and 13' can be determined by the same method as the measurement method of "the number of layers stacked with respect to each of first unit layer 12 and second unit layer 15".

<Second Layer>

Preferably, coating film 3 further includes second layer 16 disposed between substrate 2 and first A layers 13 and 13', and the composition of second layer 16 is the same as the composition of first unit layer 12 or the composition of third unit layer 17 (FIG. 3 and FIG. 4). Thus, close adhesion between substrate 2 and coating film 3 can be enhanced.

When the composition of second layer 16 is the same as the composition of first unit layer 12, oxidation starting from the interface between substrate 2 and coating film 3 can be suppressed even if substrate 2 is exposed in an early stage of cutting.

When the composition of second layer 16 is the same as the composition of first unit layer 12, the thickness of second layer 16 is preferably larger than the thickness of first unit layer 12. Thus, close adhesion between substrate 2 and coating film 3 can be more enhanced. In addition, even if substrate 2 is exposed in an early stage of cutting, oxidation starting from the interface between substrate 2 and coating film 3 can be further suppressed. Herein, "the thickness of second layer 16 is larger than the thickness of first unit layer 12" can be restated as "the thickness of second layer 16 is more than 1.0 times the thickness of first unit layer 1". The thickness of second layer 16 is preferably 2.0 times or more, more preferably 4.0 times or more, further preferably 10.0 times or more the thickness of first unit layer 12. The thickness of second layer 16 is preferably 500 times or less, more preferably 120 times or less, further preferably 50 times or less the thickness of first unit layer 12. The thickness of second layer 16 is preferably 2.0 times or more and 500 times or less, more preferably 4.0 times or more and 120 times or less, further preferably 10.0 times or more and 50 times or less the thickness of first unit layer 12.

When the composition of second layer 16 is the same as the composition of first unit layer 12, the thickness of second layer 16 is preferably 0.1 µm or more. If the thickness of second layer 16 is less than 0.1 µm, the effect of suppression of oxidation starting from the interface between substrate 2 and coating film 3 by allowing second layer 16 to be the same in composition as first unit layer 12 tends to be hardly obtained. When the composition of second layer 16 is the same as the composition of first unit layer 12, the thickness of second layer 16 is more preferably 0.3 µm or more, further preferably 0.4 µm or more. The upper limit value of the thickness of second layer 16 is not particularly limited, and if more than 2 µm, the above effect of suppression of oxidation tends not to be able to be further enhanced. Accordingly, the thickness of second layer 16 is preferably 2 µm or less in consideration of the cost advantage.

When the composition of second layer 16 is the same as the composition of first unit layer 12, first unit layer 12 (FIG. 4) or second unit layer 15 (FIG. 3), of first A layers 13 and 13', may be stacked directly on second layer 16 having the same composition as that of first unit layer 12. When the composition of second layer 16 is the same as the composition of first unit layer 12 and first unit layer 12 of first A layers 13 and 13' is stacked directly on second layer 16, second layer 16 and first unit layer 12 of first A layers 13 and 13' have a continuous crystal structure.

When the composition of second layer 16 is the same as the composition of third unit layer 17, third unit layer 17 tends to be small in stress, and thus peeling resistance of coating film 3 can be enhanced particularly in intermittent machining where a load is repeatedly applied to a cutting edge, such as milling or end milling.

When the composition of second layer 16 is the same as the composition of third unit layer 17, the thickness of second layer 16 is preferably larger than the thickness of third unit layer 17. Thus, peeling resistance of coating film 3 can be further enhanced particularly in intermittent machining where a load is repeatedly applied to a cutting edge, such as milling or end milling. Herein, "the thickness of second layer 16 is larger than the thickness of third unit layer 17" can be restated as "the thickness of second layer 16 is more than 1.0 times the thickness of third unit layer 17". The thickness of second layer 16 is preferably 2.0 times or more, more preferably 4.0 times or more, further preferably 10.0 times or more the thickness of third unit layer 17. The thickness of second layer 16 is preferably 500 times or less, more preferably 120 times or less, further preferably 50 times or less the thickness of third unit layer 17. The thickness of second layer 16 is preferably 2.0 times or more and 500 times or less, more preferably 4.0 times or more and 120 times or less, further preferably 10.0 times or more and 50 times or less the thickness of third unit layer 17.

When the composition of second layer 16 is the same as the composition of third unit layer 17, the thickness of second layer 16 is preferably 0.1 µm or more. If the thickness of second layer 16 is less than 0.1 µm, the effect of enhancing peeling resistance by allowing second layer 16 to be the same in composition as third unit layer 17 tends to be hardly obtained. When the composition of second layer 16 is the same as the composition of third unit layer 17, the thickness of second layer 16 is more preferably 0.3 µm or more, further preferably 0.4 µm or more. The upper limit value of the thickness of second layer 16 is not particularly limited, and if more than 2 µm, a more enhancement in peeling resistance described above tends not to be observed. Accordingly, the thickness of second layer 16 is preferably 2 µm or less in consideration of the cost advantage.

When the composition of second layer 16 is the same as the composition of third unit layer 17, first unit layer 12 (FIG. 4) or third unit layer 17 (FIG. 3), of first A layers 13 and 13', may be stacked directly on second layer 16 having the same composition as that of third unit layer 17. When the composition of second layer 16 is the same as the composition of third unit layer 17 and third unit layer 17 of first A layers 13 and 13' is stacked directly on second layer 16, second layer 16 and third unit layer 17 of first A layers 13 and 13' have a continuous crystal structure.

Embodiment 3: Method for Producing Cutting Tool

In Embodiment 3, a method for manufacturing the cutting tool of Embodiment 1 or Embodiment 2 is described. The manufacturing method comprises a first step of preparing a substrate, and a second step of forming a coating film on the substrate. The second step includes a step of forming a first layer or a first A layer. The detail of each step is described below.

«First Step»

In the first step, a substrate is prepared. The substrate here used can be the substrate described in Embodiment 1.

For example, when cemented carbide is used as the substrate, the substrate may be a commercially available substrate or may be manufactured by a common powder metallurgy method. In the case of manufacturing by a common powder metallurgy method, for example, a WC powder and a Co powder or the like are mixed by a ball mill or the like to obtain a mixed powder. The mixed powder is dried, and thereafter molded into a predetermined shape and thus a molded article is obtained. Furthermore, the molded article is sintered to thereby obtain WC—Co-type cemented carbide (sintered material). Next, the sintered material is subjected to predetermined cutting edge machining such as honing treatment, and thus a substrate composed of the WC—Co-type cemented carbide can be manufactured. Any substrate, even if is a substrate other than the above, can be prepared as long as it is a substrate conventionally known as the above type of the substrate.

«Second Step»

In the second step, a coating film is formed on the substrate. The second step includes a step of forming a first layer or a first A layer.

In the "forming a first layer", a first unit layer and a second unit layer are alternately stacked by use of a physical vapor deposition (PVD) method to thereby form a first layer. In the "forming a first A layer", a first unit layer and a third unit layer are alternately stacked by use of a PVD method to thereby form a first A layer. A layer composed of a compound high in crystallinity is preferably formed in order to enhance wear resistance of a coating film including the first layer or the first A layer. The present inventors have made studies about various methods, as the method for forming the first layer and first A layer, and as a result, have found that a physical vapor deposition method is preferably used.

The PVD method here used can be at least one selected from the group consisting of a cathode arc ion plating method, a balanced magnetron sputtering method, an unbalanced magnetron sputtering method, and a HiPIMS method. In particular, a cathode arc ion plating method is preferably used where a raw element is high in ionization rate. In the case of use of the cathode arc ion plating method, ion bombardment treatment of metal can be applied to a surface of the substrate before formation of the first layer, and thus close adhesion between the substrate and the coating film including the first layer is remarkably enhanced.

The cathode arc ion plating method can be performed by, for example, placing not only the substrate, but also a cathode as a target, in an apparatus, and thereafter applying a high voltage to the target to generate arc discharge, thereby ionizing and vaporizing any atom constituting the target, and depositing a substance on the substrate.

The balanced magnetron sputtering method can be performed by, for example, not only placing the substrate in an apparatus, but also placing a target on a magnetron electrode provided with a magnet for formation of an equilibrated magnetic field, applying a high-frequency power between the magnetron electrode and the substrate to thereby generate gas plasma, and allowing an ion of gas produced by generation of the gas plasma to collide with the target and depositing an atom emitted from the target, on the substrate.

The unbalanced magnetron sputtering method can be performed by, for example, non-equilibrating the magnetic field generated by the magnetron electrode in the balanced magnetron sputtering method. Furthermore, a high voltage can also be applied, and a HiPIMS method that provides a dense film can also be used.

<Other Step>

The second step can include, in addition to the "step of forming a first layer or a first A layer", surface treatment step such as surface polishing or shot blast. The second step can also include, in addition to the "step of forming a first layer or the first A layer", a step of forming other layer(s) (underlayer (second layer), intermediate layer, surface layer (third layer), and/or the like). When the coating film includes other layer(s) (underlayer (second layer), intermediate layer, surface layer (third layer) and/or the like), such other layer (s) can be formed by a conventionally known method. Such other layer(s) can be formed by a conventionally known chemical vapor deposition method or physical vapor deposition method. Such other layer(s) are/is preferably formed by a physical vapor deposition method from the viewpoint that such other layer(s) can be continuously formed together with the first unit layer and the second unit layer or the third unit layer in one physical vapor deposition apparatus.

EXAMPLES

The present embodiment will be further specifically described with reference to Examples. Herein, the present embodiment is not limited by these Examples.

Example 1

«Production of Cutting Tool»
<Production of Cutting Tools According to Samples 1-1 to 1-24, 1-27, 1-28 and 1-101 to 1-110>
(First Step: Step of Preparing Substrate)

Figure 6:
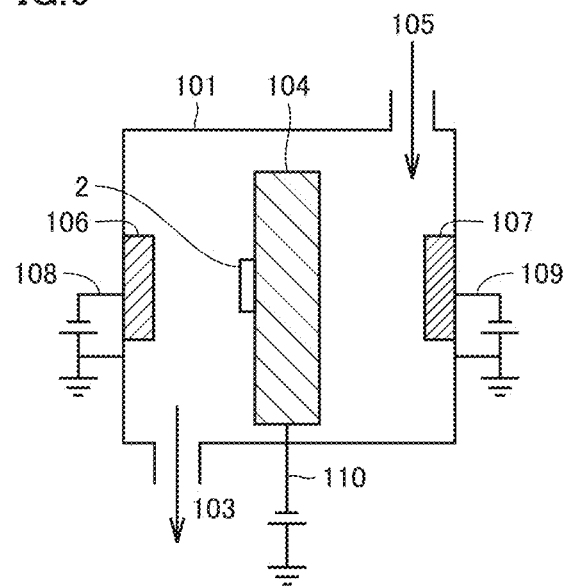
FIG. 6 is a schematic cross-sectional view of a cathode arc ion plating apparatus used in Example.
Figure 7:
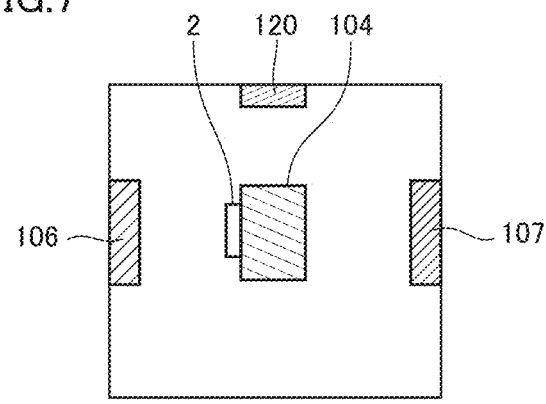
FIG. 7 is a schematic top view of the cathode arc ion plating apparatus illustrated in FIG. 6.

FIG. 6 is a schematic cross-sectional view of a cathode arc ion plating apparatus used in the present Example, and FIG. 7 is a schematic top view of the apparatus of FIG. 6.

In each apparatus of FIG. 6 and FIG. 7, a cathode 106 for a first unit layer, a cathode 107 for a second unit layer and a cathode 120 for a third layer, each being an alloy target serving as a metallic raw material of a coating film, and a rotary substrate holder 104 for placing substrate 2 are mounted in a chamber 101. An arc power supply 108 is mounted to cathode 106, and an arc power supply 109 is mounted to cathode 107. A bias power supply 110 is mounted to substrate holder 104. A gas inlet through which a gas 105 is introduced is provided and also a gas exhaust 103 for regulation of the pressure in chamber 101 is provided in chamber 101, and a structure is taken where the gas in chamber 101 can be suctioned from gas exhaust 103 by a vacuum pump.

A chip at the cemented carbide grade of JIS standard P30, having the shape of CNMG120408 of JIS standard, and a chip of SEMT13T3AGSN, manufactured by Sumitomo Electric Industries, Ltd., were each loaded as substrate 2 onto substrate holder 104.

Next, the pressure in chamber 101 was reduced by a vacuum pump and also the temperature was raised to 500° C. by a heater placed in the apparatus under rotation of substrate 2, and chamber 101 was evacuated until the pressure therein reached $10 \times 10^{-4}$ Pa. Next, an argon gas was introduced from the gas inlet to retain the pressure in chamber 101 at 2.0 Pa, the voltage of bias power supply 110 was gradually increased to −1000 V, and a surface of substrate 2 was cleaned for 15 minutes. Thereafter, an argon gas was exhausted from chamber 101 to thereby clean the substrate (argon bombardment treatment). As described above, each substrate of cutting tools according to Samples 1-1 to 1-24, 1-27, 1-28, and 1-101 to 1-110 was prepared.
(Second Step: Step of Forming Coating Film on Substrate)

Next, while nitrogen as a reaction gas was introduced in the state of rotation of substrate 2 at the center and also the temperature of substrate 2, the pressure of a reaction gas and the voltage of bias power supply 110 were respectively kept at 500° C., at 2.0 Pa and at a certain value in the range from −50 V to −200 V, an arc current of 120 A was supplied to each of cathodes 106 and 107 thereby generating metal ions from cathodes 106 and 107, to form a second layer and a first layer each having a composition shown in Table 1 and Table 2, on the substrate. Herein, the ratio of Ti, Al, and Ce, as the composition of cathode 106, was adjusted so as to be the same as the ratio as the composition of the first unit layer in Table 1 and Table 2. The ratio of Cr and Al, as the composition of cathode 107, was adjusted so as to be the same as the ratio as the composition of the second unit layer in Table 1 and Table 2.

In the case of formation of the second layer, the first layer was formed by alternately stacking a first unit layer and a second unit layer one by one on the second layer for the respective numbers of layers stacked as shown in Table 1 and Table 2. In the case of formation of no second layer, the first layer was formed by alternately stacking a first unit layer and a second unit layer one by one on the substrate for the respective numbers of layers stacked as shown in Table 1 and Table 2. The thickness of the second layer, and the thickness and the number of layers stacked with respect to each of the first unit layer and the second unit layer in the first layer were adjusted by the rotational rate of the substrate. When the respective thicknesses of the second layer and the first layer reached the thickness as shown in Table 1 and Table 2, the current supplied to a vaporization source was stopped.

Next, while nitrogen and a methane gas as reaction gases were introduced into chamber 101 and also the temperature of substrate 2, the pressure of the reaction gases and the voltage of bias power supply 110 were respectively kept at 400° C., at 2.0 Pa and at −300 V, an arc current of 100 A was supplied to cathode 120, thereby generating a metal ion from cathode 120, to form a third layer on the first layer. When the thickness of the third layer reached the thickness as shown in Table 1 and Table 2, the current supplied to a vaporization source was stopped. Herein, the ratio of Ti, Al, and Ce, as the composition of cathode 120, was adjusted so as to be the same as the ratio as the composition of the third layer in Table 1 and Table 2. The ratio of nitrogen and carbon, as the composition of the third layer, was adjusted by the ratio of the amount of nitrogen introduced and the amount of a methane gas introduced. As described above, cutting tools according to Samples 1-1 to 1-24, 1-27, 1-28, and 1-101 to 1-110 were produced.

TABLE 1

| Sample No. | First layer — First unit layer a | First unit layer b | First unit layer Average thickness [μm] | Second unit layer c | Second unit layer Average thickness [μm] | c-a | λ2/λ1 | Number of layers stacked | Thickness [μm] | Second layer Composition | Second layer Thickness [μm] | Third layer Composition | Third layer Thickness [μm] | Thickness of coating film [μm] | Cutting test 1 Cutting time [min] | Cutting test 2 Cutting length [km] |
|---|---|---|---|---|---|---|---|---|---|---|---|---|---|---|---|---|
| 1-1 | 0.350 | 0.010 | 0.050 | 0.70 | 0.03 | More than 0 | 0.6 | 40 | 3.2 | — | — | — | — | 3.2 | 56 | 4.1 |
| 1-2 | 0.650 | 0.010 | 0.3 | 0.70 | 0.4 | More than 0 | 1.3 | 5 | 3.5 | — | — | — | — | 3.5 | 57 | 4.5 |
| 1-3 | 0.550 | 0.001 | 0.005 | 0.70 | 0.015 | More than 0 | 3 | 180 | 3.6 | — | — | — | — | 3.6 | 65 | 5.2 |
| 1-4 | 0.550 | 0.100 | 0.003 | 0.70 | 0.003 | More than 0 | 1 | 500 | 3.0 | — | — | — | — | 3.0 | 66 | 5.2 |
| 1-5 | 0.360 | 0.0015 | 0.030 | 0.40 | 0.005 | More than 0 | 0.2 | 100 | 3.5 | — | — | — | — | 3.5 | 61 | 4.1 |
| 1-6 | 0.550 | 0.0015 | 0.0015 | 0.75 | 0.006 | More than 0 | 4 | 430 | 3.2 | — | — | — | — | 3.2 | 63 | 4.2 |
| 1-7 | 0.580 | 0.020 | 0.005 | 0.70 | 0.005 | More than 0 | 1 | 360 | 3.6 | — | — | — | — | 3.6 | 72 | 4.6 |
| 1-8 | 0.600 | 0.020 | 0.005 | 0.65 | 0.01 | More than 0 | 5 | 240 | 3.6 | — | — | — | — | 3.6 | 69 | 5.8 |
| 1-9 | 0.600 | 0.020 | 0.002 | 0.65 | 1 | More than 0 | 1 | 800 | 3.2 | — | — | — | — | 3.2 | 68 | 5.6 |
| 1-10 | 0.600 | 0.020 | 0.2 | 0.65 | 0.4 | More than 0 | 2 | 8 | 4.8 | — | — | — | — | 4.8 | 61 | 4.7 |
| 1-11 | 0.600 | 0.020 | 0.003 | 0.65 | 0.002 | More than 0 | 0.7 | 600 | 3.0 | — | — | — | — | 3.0 | 60 | 4.8 |
| 1-12 | 0.600 | 0.020 | 0.15 | 0.65 | 0.2 | More than 0 | 1.3 | 9 | 3.2 | — | — | — | — | 3.2 | 65 | 5.1 |
| 1-13 | 0.500 | 0.020 | 0.005 | 0.70 | 0.005 | More than 0 | 1 | 10 | 0.1 | Ti0.48Al0.50Ce0.02N | 0.5 | — | — | 0.6 | 63 | 5.0 |
| 1-14 | 0.500 | 0.020 | 0.010 | 0.65 | 0.010 | More than 0 | 1 | 150 | 3.0 | Al0.65Cr0.35N | 0.4 | — | — | 3.4 | 71 | 4.4 |
| 1-15 | 0.550 | 0.020 | 0.005 | 0.70 | 0.005 | More than 0 | 1 | 300 | 3.0 | — | — | Ti0.43Al0.55Ce0.02CN | 0.8 | 3.8 | 78 | 4.7 |
| 1-16 | 0.500 | 0.002 | 0.150 | 0.70 | 0.150 | More than 0 | 1 | 10 | 3.0 | Ti0.498Al0.500Ce0.002N | 0.4 | Ti0.48Al0.5Ce0.02CN | 0.6 | 4.0 | 81 | 4.8 |
| 1-17 | 0.500 | 0.002 | 0.050 | 0.70 | 0.050 | More than 0 | 1 | 30 | 3.0 | Ti0.498Al0.500Ce0.002N | 0.5 | Ti0.48Al0.5Ce0.02CN | 0.5 | 4.0 | 86 | 5.0 |
| 1-18 | 0.500 | 0.002 | 0.005 | 0.70 | 0.005 | More than 0 | 1.0 | 300 | 3.0 | Ti0.498Al0.500Ce0.002N | 0.6 | Ti0.48Al0.5Ce0.02CN | 0.4 | 4.0 | 89 | 5.3 |
| 1-19 | 0.500 | 0.002 | 0.005 | 0.70 | 0.005 | More than 0 | 1.0 | 350 | 3.5 | — | — | Ti0.58Al0.4Ce0.02CN | 0.5 | 4.0 | 71 | 4.4 |
| 1-20 | 0.500 | 0.005 | 0.150 | 0.70 | 0.150 | More than 0 | 1.0 | 10 | 3.0 | Ti0.495Al0.500Ce0.005N | 0.6 | Ti0.48Al0.5Ce0.02CN | 0.4 | 4.0 | 74 | 6.4 |
| 1-21 | 0.500 | 0.040 | 0.150 | 0.70 | 0.150 | More than 0 | 1.0 | 10 | 3.0 | Ti0.46Al0.500Ce0.040N | 0.6 | Ti0.48Al0.5Ce0.02CN | 0.5 | 4.1 | 77 | 6.1 |
| 1-22 | 0.500 | 0.002 | 0.003 | 0.70 | 0.008 | More than 0 | 2.7 | 270 | 3.0 | Ti0.498Al0.500Ce0.002N | 0.5 | Ti0.48Al0.5Ce0.02CN | 0.5 | 4.0 | 91 | 6.3 |
| 1-23 | 0.500 | 0.002 | 0.002 | 0.70 | 0.012 | More than 0 | 6.0 | 250 | 3.5 | Ti0.498Al0.500Ce0.002N | 0.4 | Ti0.48Al0.5Ce0.02CN | 0.6 | 4.5 | 83 | 5.6 |
| 1-24 | 0.500 | 0.002 | 0.005 | 0.70 | 0.005 | More than 0 | 1.0 | 1200 | 12.0 | Ti0.498Al0.500Ce0.002N | 0.3 | Ti0.48Al0.5Ce0.02CN | 0.5 | 12.8 | 100 | 6.7 |

TABLE 2

| | First layer | | | | | | | | | | | | | | Cutting test 1 | Cutting test 2 |
|---|---|---|---|---|---|---|---|---|---|---|---|---|---|---|---|---|
| | First unit layer | | | | Second unit layer | | | | | Number of layers stacked | Thickness [μm] | Second layer | | Third layer | | Cutting time [min] | Cutting length [km] |
| Sample No. | a | b | Average thickness [μm] | c | Average thickness [μm] | c−a | λ2/λ1 | | | Composition | Thickness [μm] | Composition | Thickness [μm] | | |
| 1-101 | 0.300 | 0.050 | 0.005 | 0.70 | 0.005 | More than 0 | 1 | 400 | 4.0 | — | — | — | — | 4.0 | 32 | 1.9 |
| 1-102 | 0.700 | 0.050 | 0.005 | 0.70 | 0.005 | 0 or less | 1 | 400 | 4.0 | — | — | — | — | 4.0 | 29 | 1.6 |
| 1-103 | 0.600 | 0.005 | 0.005 | 0.70 | 0.005 | More than 0 | 1 | 400 | 4.0 | — | — | — | — | 4.0 | 26 | 1.0 |
| 1-104 | 0.600 | 0.200 | 0.005 | 0.70 | 0.005 | More than 0 | 1 | 400 | 4.0 | — | — | — | — | 4.0 | 34 | 1.5 |
| 1-105 | 0.600 | 0.050 | 0.005 | 0.30 | 0.005 | 0 or less | 1 | 400 | 4.0 | — | — | — | — | 4.0 | 21 | 0.8 |
| 1-106 | 0.600 | 0.050 | 0.005 | 0.80 | 0.005 | More than 0 | 1 | 400 | 4.0 | — | — | — | — | 4.0 | 29 | 1.7 |
| 1-107 | 0.610 | 0.050 | 4.0 | — | — | — | — | — | 4.0 | — | — | — | — | 4.0 | 25 | 1.0 |
| 1-27 | 0.500 | 0.002 | 0.001 | 0.70 | 0.003 | More than 0 | 3 | 800 | 3.2 | — | — | — | — | 3.2 | 52 | 2.9 |
| 1-28 | 0.500 | 0.002 | 0.003 | 0.70 | 0.001 | More than 0 | 0.333 | 800 | 3.2 | — | — | — | — | 3.2 | 51 | 3.7 |
| 1-109 | 0.500 | 0 | 0.005 | 0.70 | 0.005 | More than 0 | 1 | 350 | 3.5 | Ti0.500Al0.500N | 0.5 | — | — | 4.0 | 34 | 1.5 |
| 1-110 | — | — | — | 0.60 | 4.0 | — | — | — | 4.0 | — | — | — | — | 4.0 | 25 | 1.0 |

«Evaluation»

The composition (namely, a and b) of the first unit layer, the composition (namely, c) of the second unit layer, the composition of the second layer, the composition of the third layer, the number of layers stacked, the average thickness of the first unit layer, the average thickness of the second unit layer, the thickness of the first layer, the thickness of the second layer, the thickness of the third layer, and $\lambda 2/\lambda 1$ in the cutting tool according to each Sample were measured.

<Measurement of Composition (a and b) of First Unit Layer> a in the cutting tool of each Sample was determined by the method described in Embodiment 1. The results obtained are described in the "a" column in each of Table 1 and Table 2. b in the cutting tool of each Sample was determined by the method described in Embodiment 1. The results obtained are described in the "b" column in each of Table 1 and Table 2. A case where "–" is described in the "a" column and the "b" column in each of Table 1 and Table 2 means that no first unit layer is present.

<Measurement of Composition (c) of Second Unit Layer> c in the cutting tool of each Sample was determined by the method described in Embodiment 1. The results obtained are described in the "c" column in each of Table 1 and Table 2. A case where "–" is described in the "c" column in each of Table 1 and Table 2 means that no second unit layer is present.

<Measurement of Composition of Second Layer and Composition of Third Layer>

The composition of the second layer in the cutting tool of each Sample was determined by the method described in Embodiment 1. The results obtained are described in the "Composition" column in the "Second layer" column in each of Table 1 and Table 2. The composition of the third layer in the cutting tool of each Sample was determined by the method described in Embodiment 1. The results obtained are described in the "Composition" column in the "Third layer" column in each of Table 1 and Table 2. A case where "–" is described in the "Composition" column in the "Second layer" column in each of Table 1 and Table 2 means that no second layer is present, and a case where "–" is described in the "Composition" column in the "Third layer" column in each of Table 1 and Table 2 means that no third layer is present.

<Measurement of Number of Layers Stacked>

The number of layers stacked in the cutting tool of each Sample was determined by the method described in Embodiment 1. The results obtained are described in the "Number of layers stacked" column in each of Table 1 and Table 2.

<Measurement of Average Thickness of First Unit Layer, Average Thickness of Second Unit Layer, Thickness of First Layer, Thickness of Second Layer, and Thickness of Third Layer>

The average thickness of the first unit layer in the cutting tool of each Sample was determined by the method described in Embodiment 1. The results obtained are described in the "Average thickness [μm]" column in the "First unit layer" column in each of Table 1 and Table 2. The average thickness of the second unit layer in the cutting tool of each Sample was determined by the method described in Embodiment 1. The results obtained are described in the "Average thickness [μm]" column in the "Second unit layer" column in each of Table 1 and Table 2. The thickness of the first layer in the cutting tool of each Sample was determined by the method described in Embodiment 1. The results obtained are described in the "Thickness [μm]" column in the "First layer" column in each of Table 1 and Table 2. The thickness of the second layer in the cutting tool of each Sample was determined by the method described in Embodiment 1. The results obtained are described in the "Thickness [μm]" column in the "Second layer" column in each of Table 1 and Table 2. The thickness of the third layer in the cutting tool of each Sample was determined by the method described in Embodiment 1. The results obtained are described in the "Thickness [μm]" column in the "Third layer" column in each of Table 1 and Table 2. A case where "–" is described in the "Average thickness [μm]" column in the "First unit layer" column in each of Table 1 and Table 2 means that no first unit layer is present. A case where "–" is described in the "Average thickness [μm]" column in the "Second unit layer" column in each of Table 1 and Table 2 means that no second unit layer is present. A case where "–" is described in the "Thickness [μm]" column in the "Second layer" column in each of Table 1 and Table 2 means that no second layer is present. A case where "–" is described in the "Thickness [μm]" column in the "Third layer" column in each of Table 1 and Table 2 means that no third layer is present.

<Measurement of $\lambda 2/\lambda 1$>

$\lambda 2/\lambda 1$ in the cutting tool of each Sample was determined by the method described in Embodiment 1. The results obtained are described in the "$\lambda 2/\lambda 1$" column in each of Table 1 and Table 2. A case where "–" is described in the "$\lambda 2/\lambda 1$" column in each of Table 1 and Table 2 means that at least any of the first unit layer and the second unit layer is not present.

<Evaluation of Life of Cutting Tool>

(Cutting Test 1: Continuous Turning Test)

Each of the cutting tools, having the shape of CNMG120408, according to Samples 1-1 to 1-24, 1-27, 1-28, and 1-101 to 1-110, was subjected to a dry continuous turning test under the following cutting conditions, and the time until the amount of wear of the flank face of the cutting edge reached 0.2 mm was measured. The results are shown in the "Cutting time [min]" column in each of Table 1 and Table 2. In Table 1 and Table 2, a longer cutting time indicates a longer tool life.

(Cutting Conditions)

Workpiece: SCM440 (HB=300)
Cutting speed: 250 m/min
Feeding speed: 0.3 mm/rev
Incision: 2.0 mm
Coolant: dry Cutting machining carried out under the cutting conditions is high-speed and high-efficiency machining of a hard-to-cut material, and corresponds to cutting machining to be carried out under a high cutting edge temperature condition.

The cutting tools according to Samples 1-1 to 1-24, 1-27, and 1-28 were each confirmed to be significantly reduced in amount of wear of the flank face of the cutting edge in the continuous turning test, as compared with the cutting tools according to Samples 1-101 to 1-110. In other words, the cutting tools according to Samples 1-1 to 1-24, 1-27, and 1-28 were each confirmed to have a long tool life particularly even in cutting machining to be carried out under a high cutting edge temperature condition, as compared with the cutting tools according to Samples 1-101 to 1-110.

(Cutting Test 2: Milling Test)

Surface milling of each of the cutting tools of Samples 1-1 to 1-24, 1-27, 1-28, and 1-101 to 1-110, having the shape of SEMT13T3AGSN, was carried out (namely, a dry milling test was carried out) under the following cutting conditions with the centerline of a plate composed of a hard-to-cut material, having a width of 150 mm, and the center of a wider cutter of φ160 mm, than the plate, being aligned, and the cutting length until the amount of wear of the flank face of the cutting edge reached 0.2 mm was measured. The results are shown in the "Cutting length [km]" column in each of Table 1 and Table 2. In Table 1 and Table 2, a longer cutting length indicates a longer tool life.

(Cutting Conditions)

Workpiece: SKD11 (HB=235)

Cutting speed: 180 m/min

Feeding speed: 0.15 mm/t

Incision ap in axial direction: 1.5 mm

Incision ae in radial direction: 150 mm

Coolant: dry

Cutting machining carried out under the cutting conditions is milling of a hard-to-cut material under high-speed/high-efficiency and dry conditions, and corresponds to cutting machining to be carried out under a high cutting edge temperature condition.

The cutting tools according to Samples 1-1 to 1-24, 1-27, and 1-28 were each confirmed to be significantly increased in cutting length of the cutting edge, as compared with the cutting tools according to Samples 1-101 to 1-110. In other words, the cutting tools according to Samples 1-1 to 1-24, 1-27, and 1-28 were each confirmed to have a long tool life particularly even in cutting machining to be carried out under a high cutting edge temperature condition, as compared with the cutting tools according to Samples 1-101 to 1-110.

Example 2

«Production of Cutting Tool»
<Production of Cutting Tools According to Samples 2-1 to 2-19 and 2-101 to 2-110>

The cutting tools according to Samples 2-1 to 2-19, and 2-101 to 2-110 were each produced by the same method as in the cutting tools according to Samples 1-1 to 1-24, 1-27, 1-28, and 1-101 to 1-110 except for, in the second step, the point "a second layer and a "first A layer" each having a composition as shown in "Table 3 and Table 4" were formed on the substrate; herein, the ratio of Ti, Al, and Ce, as the composition of cathode 106, was adjusted so as to be the same as the ratio as the composition of the first unit layer in "Table 3 and Table 4"; the ratio of Cr, Al, "Si and B", as the composition of cathode 107, was adjusted so as to the same as the ratio as the composition of the "third unit layer" in "Table 3 and Table 4"", the point "in the case of formation of the second layer, the "first A layer" was formed by alternately stacking a first unit layer and a "third unit layer" one by one on the second layer for the respective numbers of layers stacked as shown in "Table 3 and Table 4"; in the case of formation of no second layer, the "first A layer" was formed by alternately stacking a first unit layer and a "third unit layer" one by one on the substrate for the respective numbers of layers stacked as shown in "Table 3 and Table 4"", the point "when the thicknesses of the second layer and the "first A layer" each reached the thickness as shown in "Table 3 and Table 4", the current supplied to a vaporization source was stopped", and the point "when the thickness of the third layer reached the thickness as shown in "Table 3 and Table 4", the current supplied to a vaporization source was stopped; herein, the ratio of Ti, Al, and Ce, as the composition of cathode 120, was adjusted so as to be the same as the ratio as the composition of the third layer in "Table 3 and Table 4"".

TABLE 3

| Sample No. | First A layer | | | | | | | | | | | | Second layer | | Third layer | | Thickness of coating film [μm] | Cutting test 3 Cutting time [min] | Cutting test 4 Cutting length [km] |
|---|---|---|---|---|---|---|---|---|---|---|---|---|---|---|---|---|---|---|---|
| | First unit layer | | | Third unit layer | | | | | | | Number of layers stacked | Thickness [μm] | Composition | Thickness [μm] | Composition | Thickness [μm] | | | |
| | a | b | Average thickness [μm] | d | e | M | Average thickness [μm] | d-a | λ3/λ1 | | | | | | | | | | |
| 2-1 | 0.350 | 0.01 | 0.05 | 0.70 | 0.02 | Si | 0.03 | More than 0 | 0.6 | | 40 | 3.2 | - | - | - | - | 3.2 | 69 | 6.5 |
| 2-2 | 0.650 | 0.01 | 0.3 | 0.70 | 0.03 | B | 0.4 | More than 0 | 1.3 | | 5 | 3.5 | - | - | - | - | 3.5 | 74 | 7.7 |
| 2-3 | 0.600 | 0.001 | 0.005 | 0.70 | 0.02 | B | 0.015 | More than 0 | 3.0 | | 700 | 14.0 | - | - | - | - | 14.0 | 102 | 8.9 |
| 2-4 | 0.550 | 0.100 | 0.003 | 0.70 | 0.03 | Si | 0.003 | More than 0 | 1.0 | | 500 | 3.0 | - | - | - | - | 3.0 | 71 | 6.6 |
| 2-5 | 0.036 | 0.0015 | 0.03 | 0.40 | 0.03 | B | 0.005 | More than 0 | 0.2 | | 100 | 3.5 | - | - | - | - | 3.5 | 88 | 8.3 |
| 2-6 | 0.055 | 0.0015 | 0.0015 | 0.75 | 0.03 | Si | 0.008 | More than 0 | 5.3 | | 430 | 4.1 | - | - | - | - | 4.1 | 76 | 7.8 |
| 2-7 | 0.600 | 0.020 | 0.008 | 0.65 | 0.01 | Si | 0.01 | More than 0 | 1.25 | | 400 | 7.2 | - | - | - | - | 7.2 | 99 | 8.4 |
| 2-8 | 0.600 | 0.020 | 0.008 | 0.65 | 0.05 | B | 0.01 | More than 0 | 1.25 | | 180 | 3.2 | - | - | - | - | 3.2 | 81 | 7.9 |
| 2-9 | 0.550 | 0.010 | 0.3 | 0.70 | 0.02 | B | 0.3 | More than 0 | 1 | | 5 | 3.0 | - | - | - | - | 3.0 | 72 | 6.7 |
| 2-10 | 0.550 | 0.010 | 0.01 | 0.70 | 0.02 | Si | 0.05 | More than 0 | 5 | | 50 | 3.0 | - | - | - | - | 3.0 | 78 | 7.9 |
| 2-11 | 0.600 | 0.020 | 0.002 | 0.70 | 0.01 | Si | 0.003 | More than 0 | 1.5 | | 600 | 3.0 | - | - | - | - | 3.0 | 74 | 7.2 |
| 2-12 | 0.600 | 0.020 | 0.2 | 0.70 | 0.01 | B | 0.6 | More than 0 | 3 | | 5 | 4.0 | - | - | - | - | 4.0 | 94 | 8.2 |
| 2-13 | 0.600 | 0.010 | 0.0015 | 0.65 | 0.01 | B | 0.002 | More than 0 | 1.3 | | 900 | 3.2 | - | - | - | - | 3.2 | 79 | 7.8 |
| 2-14 | 0.550 | 0.010 | 0.1 | 0.65 | 0.01 | Si | 0.2 | More than 0 | 2 | | 10 | 3.0 | - | - | - | - | 3.0 | 72 | 6.6 |
| 2-15 | 0.600 | 0.010 | 0.001 | 0.70 | 0.02 | Si | 0.0015 | More than 0 | 1.5 | | 1300 | 3.3 | Ti0.39Al0.600Ce0.010N | 0.5 | - | - | 3.8 | 75 | 7.5 |
| 2-16 | 0.500 | 0.010 | 0.015 | 0.70 | 0.02 | B | 0.015 | More than 0 | 1 | | 115 | 3.5 | Ti0.49Al0.500Ce0.010N | 0.5 | - | - | 4.0 | 95 | 8.7 |
| 2-17 | 0.500 | 0.020 | 0.005 | 0.67 | 0.03 | Si | 0.005 | More than 0 | 1 | | 300 | 3.0 | - | - | Ti0.48Al0.50Ce0.02CN | 0.6 | 3.6 | 83 | 8.0 |
| 2-18 | 0.500 | 0.020 | 0.005 | 0.67 | 0.03 | B | 0.005 | More than 0 | 1 | | 300 | 3.0 | - | - | Ti0.48Al0.50Ce0.02CN | 0.4 | 3.4 | 81 | 7.9 |
| 2-19 | 0.500 | 0.010 | 0.004 | 0.70 | 0.03 | B | 0.001 | More than 0 | 4 | | 700 | 3.5 | - | - | - | - | 3.5 | 68 | 6.0 |

TABLE 4

| Sample No. | First A layer | | | | | | | | | | | Second layer | | | Third layer | | | Thickness of coating film [μm] | Cutting test 3 Cutting time [min] | Cutting test 4 Cutting length [km] |
|---|---|---|---|---|---|---|---|---|---|---|---|---|---|---|---|---|---|---|---|---|
| | First unit layer | | | Third unit layer | | | | | | | | Composition | Thickness [μm] | | Composition | Thickness [μm] | | | | |
| | a | b | Average thickness [μm] | d | e | M | Average thickness [μm] | d-a | λ3/λ1 | Number of layers stacked | Thickness [μm] | | | | | | | | | |
| 2-101 | 0.250 | 0.010 | 0.07 | 0.70 | 0.02 | B | 0.08 | More than 0 | 1 | 25 | 3.8 | — | — | | — | — | | 3.8 | 29 | 2.2 |
| 2-102 | 0.700 | 0.010 | 0.07 | 0.73 | 0.02 | Si | 0.08 | More than 0 | 1 | 20 | 3.0 | — | — | | — | — | | 3.0 | 31 | 2.5 |
| 2-103 | 0.600 | 0 | 0.06 | 0.70 | 0.02 | Si | 0.07 | More than 0 | 1.2 | 20 | 2.6 | — | — | | — | — | | 2.6 | 26 | 2.1 |
| 2-104 | 0.600 | 0 | 0.07 | 0.70 | 0.02 | B | 0.08 | More than 0 | 1.1 | 20 | 3.0 | — | — | | — | — | | 3.0 | 33 | 3.2 |
| 2-105 | 0.600 | 0.150 | 0.1 | 0.70 | 0.02 | B | 0.1 | More than 0 | 1 | 18 | 3.6 | — | — | | — | — | | 3.6 | 35 | 3.4 |
| 2-106 | 0.650 | 0.020 | 0.08 | 0.30 | 0.01 | Si | 0.08 | More than 0 | 1 | 22 | 3.5 | — | — | | — | — | | 3.5 | 21 | 2.3 |
| 2-107 | 0.650 | 0.020 | 0.06 | 0.80 | 0.01 | B | 0.06 | More than 0 | 1 | 25 | 3.0 | — | — | | — | — | | 3.0 | 28 | 2.7 |
| 2-108 | 0.600 | 0.020 | 0.15 | 0.70 | 0 | — | 0.15 | More than 0 | 1 | 11 | 3.3 | — | — | | — | — | | 3.3 | 48 | 4.3 |
| 2-109 | 0.600 | 0.020 | 0.07 | 0.70 | 0.07 | Si | 0.07 | More than 0 | 1 | 22 | 3.1 | — | — | | — | — | | 3.1 | 23 | 2.1 |
| 2-110 | 0.550 | 0.010 | 3.5 | — | — | — | — | — | — | — | 3.5 | — | — | | — | — | | 3.5 | 18 | 1.6 |

«Evaluation»

The composition (namely, a and b) of the first unit layer, the composition (namely, d and e) of the third unit layer, the composition of the second layer, the composition of the third layer, the number of layers stacked, the average thickness of the first unit layer, the average thickness of the third unit layer, the thickness of the first A layer, the thickness of the second layer, the thickness of the third layer, and $\lambda3/\lambda1$ in the cutting tool according to each Sample were measured.

<Measurement of Composition (a and b) of First Unit Layer> a in the cutting tool of each Sample was determined by the method described in Embodiment 1. The results obtained are described in the "a" column in each of Table 3 and Table 4. b in the cutting tool of each Sample was determined by the method described in Embodiment 1. The results obtained are described in the "b" column in each of Table 3 and Table 4.

<Measurement of Composition (d and e) of Second Unit Layer> d in the cutting tool of each Sample was determined by the method described in Embodiment 2. The results obtained are described in the "d" column in each of Table 3 and Table 4. e in the cutting tool of each Sample was determined by the method described in Embodiment 2. The results obtained are described in the "e" column in each of Table 3 and Table 4. A case where "–" is described in the "d" column and "e" column in each of Table 3 and Table 4 means that no third unit layer is present.

<Measurement of Composition of Second Layer and Composition of Third Layer>

The composition of the second layer in the cutting tool of each Sample was determined by the method described in Embodiment 1. The results obtained are described in the "Composition" column in the "Second layer" column in each of Table 3 and Table 4. The composition of the third layer in the cutting tool of each Sample was determined by the method described in Embodiment 1. The results obtained are described in the "Composition" column in the "Third layer" column in each of Table 3 and Table 4. A case where "–" is described in the "Composition" column in the "Second layer" column in each of Table 3 and Table 4 means that no second layer is present, and a case where "–" is described in the "Composition" column in the "Third layer" column in each of Table 3 and Table 4 means that no third layer is present.

<Measurement of Number of Layers Stacked>

The number of layers stacked in the cutting tool of each Sample was determined by the method described in Embodiment 2. The results obtained are described in the "Number of layers stacked" column in each of Table 3 and Table 4.

<Measurement of Average Thickness of First Unit Layer, Average Thickness of Third Unit Layer, Thickness of First A Layer, Thickness of Second Layer, and Thickness of Third Layer>

The average thickness of the first unit layer in the cutting tool of each Sample was determined by the method described in Embodiment 2. The results obtained are described in the "Average thickness [μm]" column in the "First unit layer" column in each of Table 3 and Table 4. The average thickness of the third unit layer in the cutting tool of each Sample was determined by the method described in Embodiment 2. The results obtained are described in the "Average thickness [μm]" column in the "Third unit layer" column in each of Table 3 and Table 4. The thickness of the first A layer in the cutting tool of each Sample was determined by the method described in Embodiment 2. The results obtained are described in the "Thickness [μm]" column in the "First A layer" column in each of Table 3 and Table 4. The thickness of the second layer in the cutting tool of each Sample was determined by the method described in Embodiment 1. The results obtained are described in the "Thickness [μm]" column in the "Second layer" column in each of Table 3 and Table 4. The thickness of the third layer in the cutting tool of each Sample was determined by the method described in Embodiment 1. The results obtained are described in the "Thickness [μm]" column in the "Third layer" column in each of Table 3 and Table 4. A case where "–" is described in the "Average thickness [μm]" column in the "First unit layer" column in each of Table 3 and Table 4 means that no first unit layer is present. A case where "–" is described in the "Average thickness [μm]" column in the "Third unit layer" column in each of Table 3 and Table 4 means that no third unit layer is present. A case where "–" is described in the "Thickness [μm]" column in the "Second layer" column in each of Table 3 and Table 4 means that no second layer is present. A case where "–" is described in the "Thickness [μm]" column in the "Third layer" column in each of Table 3 and Table 4 means that no third layer is present.

<Measurement of $\lambda3/\lambda1$>

$\lambda3/\lambda1$ in the cutting tool of each Sample was determined by the method described in Embodiment 2. The results obtained are described in the "$\lambda3/\lambda1$" column in each of Table 3 and Table 4. A case where "–" is described in the "$\lambda3/\lambda1$" column in each of Table 3 and Table 4 means that at least any of the first unit layer and the third unit layer is not present.

<Evaluation of Life of Cutting Tool>

(Cutting Test 3: Continuous Turning Test)

Each of the cutting tools, having the shape of CNMG120408, according to Samples 2-1 to 2-19, and 2-101 to 2-110, was subjected to a dry continuous turning test under the following cutting conditions, and the time until the amount of wear of the flank face of the cutting edge reached 0.2 mm was measured. The results are shown in the "Cutting time [min]" column in each of Table 3 and Table 4. In Table 2, a longer cutting time indicates a longer tool life.

(Cutting Conditions)
Workpiece: Inconel 718 (aging material: HB=400)
Cutting speed: 65 m/min
Feeding speed: 0.15 mm/rev
Incision: 1.0 mm
Coolant: dry Cutting machining carried out under the cutting conditions is high-speed and high-efficiency machining of a hard-to-cut material, and corresponds to cutting machining to be carried out under a high cutting edge temperature condition.

The cutting tools according to Samples 2-1 to 2-19 were each confirmed to be significantly reduced in amount of wear of the flank face of the cutting edge in the continuous turning test, as compared with the cutting tools according to Samples 2-101 to 2-110. In other words, the cutting tools according to Samples 2-1 to 2-19 were each confirmed to have a long tool life particularly even in cutting machining to be carried out under a high cutting edge temperature condition, as compared with the cutting tools according to Samples 2-101 to 2-110.

(Cutting Test 4: Milling Test)

Surface milling of each of the cutting tools of Sample 2-1 to 2-19, and 2-101 to 2-110, having the shape of SEMT13T3AGSN, was carried out (namely, a dry milling test was carried out) under the following cutting conditions with the centerline of a plate composed of a hard-to-cut material, having a width of 150 mm, and the center of a wider cutter of φ160 mm, than the plate, being aligned, and the cutting length until the amount of wear of the flank face of the cutting edge reached 0.2 mm was measured. The results are shown in the "Cutting length [km]" column in each of Table 3 and Table 4. In Table 2, a longer cutting length indicates a longer tool life.

(Cutting Conditions)

Workpiece: FCD700 (HB=250)
Cutting speed: 250 m/min
Feeding speed: 0.2 mm/t
Incision ap in axial direction: 2.0 mm
Incision ae in radial direction: 150 mm
Coolant: dry Cutting machining carried out under the cutting conditions is milling of a hard-to-cut material under high-speed/high-efficiency and dry conditions, and corresponds to cutting machining to be carried out under a high cutting edge temperature condition.

The cutting tools according to Samples 2-1 to 2-19 were each confirmed to be significantly increased in cutting length of the cutting edge, as compared with the cutting tools according to Samples 2-101 to 2-110. In other words, the cutting tools according to Samples 2-1 to 2-19 were each confirmed to have a long tool life particularly even in cutting machining to be carried out under a high cutting edge temperature condition, as compared with the cutting tools according to Samples 2-101 to 2-110.

While embodiments and Examples of the present disclosure are described as above, it is also expected from the beginning that the respective configurations of embodiments and Examples described above are appropriately combined and/or variously modified.

Embodiments and Examples here disclosed are illustrative in every regard and are to be considered not to be limitative. The scope of the present invention is indicated by not embodiments and Examples described above, but claims, and it is meant that all modifications falling within the meanings and scopes equivalent to claims are encompassed.

REFERENCE SIGNS LIST

1 cutting tool, 2 substrate, 3 coating film, 12 first unit layer, 13, 13' first layer, first A layer, 14 third layer, 15 second unit layer, 16 second layer, 17 third unit layer, 101 chamber, 103 gas exhaust, 104 substrate holder, 105 gas, 106, 107, 120 cathode, 108, 109 arc power supply, 110 bias power supply.

The invention claimed is:

1. A cutting tool comprising a substrate and a coating film disposed on the substrate, wherein
   the coating film includes a first A layer,
   the first A layer comprises a first unit layer and a third unit layer that are alternately stacked,
   the first unit layer is composed of $Ti_{1-a-b}Al_aCe_bN$,
   a is 0.350 or more and 0.650 or less,
   b is 0.001 or more and 0.100 or less,
   the third unit layer is composed of $Al_dCr_{1-d-e}M_eN$,
   M is silicon or boron,
   d is 0.40 or more and 0.75 or less,
   e is more than 0 and 0.05 or less, and
   a and d satisfy a relationship of d>a;
   wherein the coating film further includes a second unit layer disposed between the substrate and the first A layer;
   wherein the second unit layer has a composition that is the same as a composition of the first unit layer or a composition of the third unit layer;
   wherein the second unit layer has a thickness of 0.1 μm or more; and
   wherein the thickness of the second unit layer is 2.0 times or more and 500 times or less than a thickness of the first unit layer or the third unit layer.

2. The cutting tool according to claim 1, wherein, in the first unit layer and the third unit layer adjacent to the first unit layer, a ratio $\lambda3/\lambda1$ of a thickness $\lambda3$ of the third unit layer to a thickness $\lambda1$ of the first unit layer is 1 or more and 5 or less.

3. The cutting tool according to claim 1, wherein M is silicon.

4. The cutting tool according to claim 1, wherein M is boron.

5. The cutting tool according to claim 1, wherein
   an average thickness of the first unit layer is 0.002 μm or more and 0.2 μm or less, and
   an average thickness of the third unit layer is 0.002 μm or more and 0.2 μm or less.

6. The cutting tool according to claim 1, wherein the composition of the second layer is the same as the composition of the first unit layer, and a thickness of the second layer is larger than a thickness of the first unit layer.

7. The cutting tool according to claim 1, wherein the composition of the second layer is the same as the composition of the third unit layer, and a thickness of the second layer is larger than a thickness of the third unit layer.

8. The cutting tool according to claim 1, wherein
   the coating film further includes a third layer provided on the first A layer opposite to the substrate, and
   the third layer is composed of TiAlCeCN.

\* \* \* \* \*

UNITED STATES PATENT AND TRADEMARK OFFICE
CERTIFICATE OF CORRECTION

PATENT NO. : 12,173,411 B2  
APPLICATION NO. : 18/033361  
DATED : December 24, 2024  
INVENTOR(S) : Haruyo Fukui et al.

Page 1 of 1

It is certified that error appears in the above-identified patent and that said Letters Patent is hereby corrected as shown below:

In the Claims

Column 38, Lines 15-25, Claim 1:
"wherein the coating film further includes a second unit layer disposed between the substrate and the first A layer;
wherein the second unit layer has a composition that is the same as a composition of the first unit layer or a composition of the third unit layer;
wherein the second unit layer has a thickness of 0.1 μm or more; and
wherein the thickness of the second unit layer is 2.0 times or more and 500 times or less than a thickness of the first unit layer or the third unit layer."

Should read:
-- wherein the coating film further includes a second layer disposed between the substrate and the first A layer;
wherein the second layer has a composition that is the same as a composition of the first unit layer or a composition of the third unit layer;
wherein the second layer has a thickness of 0.1 μm or more; and
wherein the thickness of the second layer is 2.0 times or more and 500 times or less than a thickness of the first unit layer or the third unit layer. --.

Signed and Sealed this  
Eleventh Day of February, 2025

Coke Morgan Stewart  
*Acting Director of the United States Patent and Trademark Office*